(12) United States Patent
Otsuji

(10) Patent No.: US 11,201,067 B2
(45) Date of Patent: Dec. 14, 2021

(54) SUBSTRATE TREATMENT METHOD AND SUBSTRATE TREATMENT DEVICE

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 326 days.

(21) Appl. No.: 15/743,713

(22) PCT Filed: Jul. 5, 2016

(86) PCT No.: PCT/JP2016/069932
§ 371 (c)(1),
(2) Date: Jan. 11, 2018

(87) PCT Pub. No.: WO2017/029900
PCT Pub. Date: Feb. 23, 2017

(65) Prior Publication Data
US 2018/0269079 A1    Sep. 20, 2018

(30) Foreign Application Priority Data

Aug. 18, 2015 (JP) .............................. JP2015-161326

(51) Int. Cl.
*H01L 21/67* (2006.01)
*H01L 21/02* (2006.01)

(52) U.S. Cl.
CPC .. *H01L 21/67034* (2013.01); *H01L 21/02052* (2013.01); *H01L 21/67028* (2013.01); *H01L 21/67051* (2013.01)

(58) Field of Classification Search
CPC ......... H01L 21/67034; H01L 21/67051; H01L 21/02052; H01L 21/67028; H01L 21/6715;

(Continued)

(56) References Cited

U.S. PATENT DOCUMENTS 5,271,774 A * 12/1993 Leenaars ........... H01L 21/67034
134/31
5,660,642 A * 8/1997 Britten .................... B08B 3/041
134/30

(Continued)

FOREIGN PATENT DOCUMENTS

JP    11-145099 A    5/1999
JP    2004-128495 A    4/2004

(Continued)

OTHER PUBLICATIONS

International Search Report dated Aug. 30, 2016 in corresponding PCT International Application No. PCT/JP2016/069932.

(Continued)

*Primary Examiner* — Nadine G Norton
*Assistant Examiner* — Christopher Remavege
(74) *Attorney, Agent, or Firm* — Ostrolenk Faber LLP

(57) ABSTRACT

A substrate processing method including a vapor atmosphere filling step in which a vapor atmosphere which contains vapor of a low surface tension liquid whose lower surface tension than a processing liquid is filled around a liquid film of the processing liquid, a thin film region forming step in which, in parallel with the vapor atmosphere filling step, a substrate is rotated at a predetermined thin film region forming speed, to partially remove the processing liquid, thereby forming a thin film region on the liquid film of the processing liquid, a thin film region expanding step in which, in parallel with the vapor atmosphere filling step, the thin film region is expanded to an outer circumference of the substrate, and a thin film removing step in which the thin film is removed from the upper surface after the thin film region expanding step.

11 Claims, 18 Drawing Sheets

(58) Field of Classification Search
CPC ............... H01L 21/6704; H01L 21/304; H01L 21/02343; H01L 21/02307
USPC ..................................................... 134/30, 31
See application file for complete search history.

(56) References Cited

U.S. PATENT DOCUMENTS

| | | | | |
|---|---|---|---|---|
| 7,614,411 | B2* | 11/2009 | Korolik | H01L 21/67028 134/102.1 |
| 10,615,026 | B2* | 4/2020 | Iwahata | H01L 21/02307 |
| 2001/0042555 | A1* | 11/2001 | Bergman | B08B 3/02 134/1.3 |
| 2004/0060190 | A1* | 4/2004 | Lee | H01L 21/67034 34/59 |
| 2006/0099339 | A1* | 5/2006 | Hashizume | H01L 21/67051 427/240 |
| 2006/0219258 | A1* | 10/2006 | Gast | H01L 21/02063 134/2 |
| 2006/0231125 | A1* | 10/2006 | Yi | H01L 21/67028 134/33 |
| 2008/0190454 | A1* | 8/2008 | Eitoku | H01L 21/02057 134/19 |
| 2008/0314870 | A1* | 12/2008 | Inoue | H01L 21/67034 216/38 |
| 2009/0032067 | A1* | 2/2009 | Kojimaru | H01L 21/67034 134/26 |
| 2009/0101181 | A1 | 4/2009 | Morisawa et al. | 134/94.1 |
| 2011/0155181 | A1* | 6/2011 | Inatomi | H01L 21/02052 134/30 |
| 2015/0279708 | A1* | 10/2015 | Kobayashi | H01L 21/6704 438/747 |

FOREIGN PATENT DOCUMENTS

| | | | |
|---|---|---|---|
| JP | 2007-158270 | A | 6/2007 |
| JP | 2008-034455 | A | 2/2008 |
| JP | 2008-034612 | A | 2/2008 |
| JP | 2008034455 | A * | 2/2008 |
| JP | 2009-238793 | A | 10/2009 |
| JP | 2013-131783 | A | 7/2013 |

OTHER PUBLICATIONS

Written Opinion dated Aug. 30, 2016 in corresponding PCT International Application No. PCT/JP2016/069932.
International Preliminary Report on Patentability (Chapter I) with Notification from the International Bureau Form PCT/IB/326 for International Application No. PCT/JP2016/069932 dated Mar. 1, 2018.
English translation of the International Preliminary Report on Patentability (Chapter I) with Notification from the International Bureau Form PCT/IB/338 International Application No. PCT/JP2016/069932 dated Mar. 1, 2018.

* cited by examiner

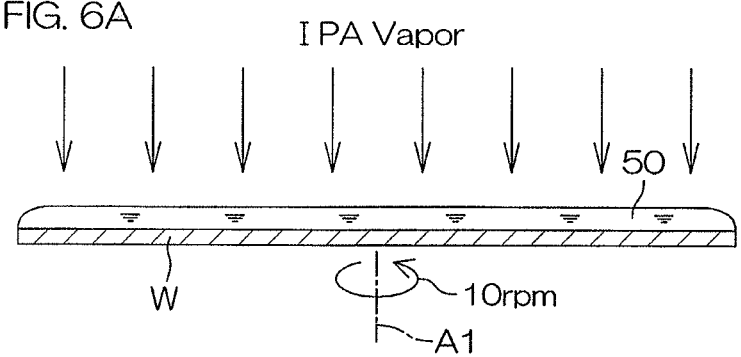

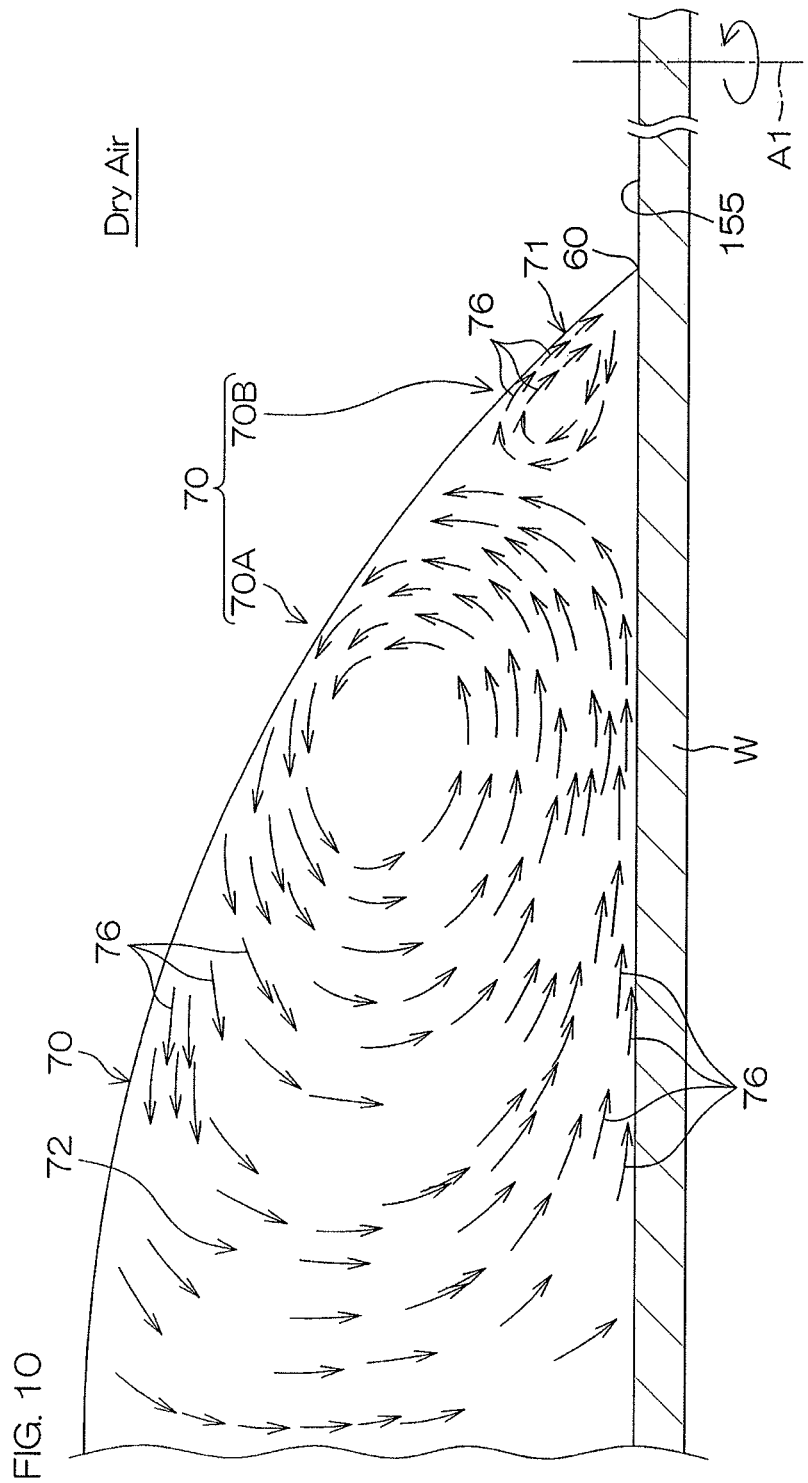

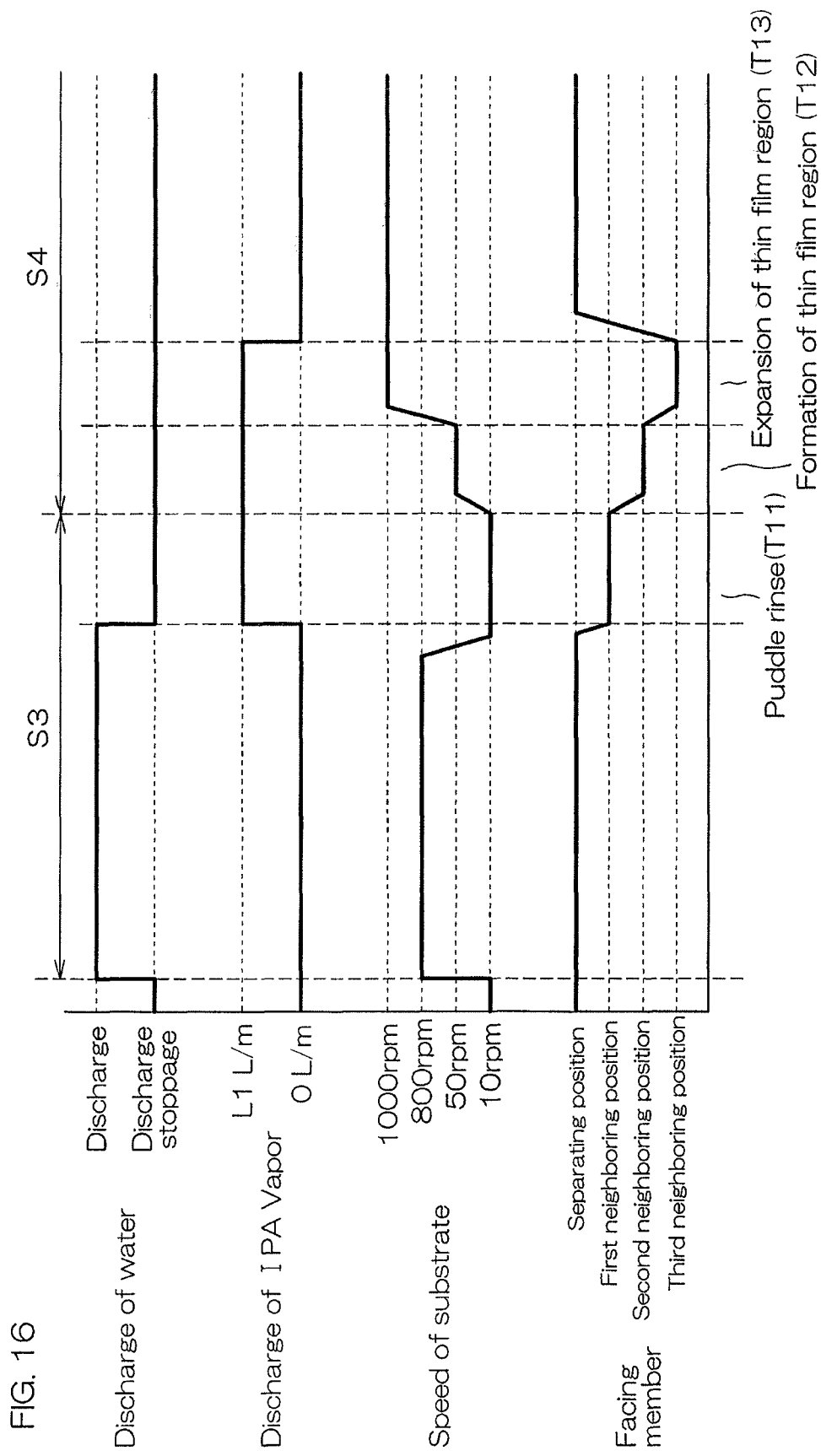

ately, in an attempt to state in an attempt to reduce occurrence of a water mark. For example, Rotagoni drying (refer to Patent Literature 1) is one example of the method.

SUBSTRATE TREATMENT METHOD AND SUBSTRATE TREATMENT DEVICE

CROSS-REFERENCE TO RELATED APPLICATIONS

The present application is a 35 U.S.C. §§ 371 national phase conversion of PCT/JP2016/069932, filed Jul. 5, 2016, which claims priority to Japanese Patent Application No. 2015-161326, filed Aug. 18, 2015, the contents of both of which are incorporated herein by reference. The PCT International Application was published in the Japanese language.

TECHNICAL FIELD

The present invention relates to a substrate processing method and a substrate processing apparatus which processes an upper surface of a substrate by using a processing liquid. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

In a manufacturing process for semiconductor devices, a processing liquid is supplied onto a front surface of a substrate of a semiconductor wafer, etc., to process the front surface of the substrate by using the processing liquid.

For example, a single substrate processing type substrate processing apparatus which processes substrates one by one is provided with a spin chuck which holds a substrate substantially horizontally to rotate the substrate and a nozzle which supplies a processing liquid to an upper surface of the substrate rotated by the spin chuck. For example, a chemical liquid is supplied to the substrate held by the spin chuck and, thereafter, a rinse liquid is supplied, by which the chemical liquid on the substrate is replaced with the rinse liquid. Thereafter, drying process is performed for removing the rinse liquid from the upper surface side of the substrate.

As a drying process, there is known a technique for supplying vapor of isopropyl alcohol (IPA) lower in boiling point than water to a front surface of a substrate in a rotation state in an attempt to reduce occurrence of a water mark. For example, Rotagoni drying (refer to Patent Literature 1) is one example of the method.

CITATION LIST

Patent Literature

Patent Literature 1: Japanese Patent Application Publication No. 2013-131783

SUMMARY OF INVENTION

Technical Problem

As the above-described drying method, specifically, a liquid film of a processing liquid (rinse liquid) is formed on an upper surface of a substrate, vapor of a low surface tension liquid (IPA) is sprayed to the liquid film of the processing liquid to form a liquid film-removed region. Then, the liquid film-removed region is expanded and the liquid film-removed region is extended to an entire surface on the upper surface of the substrate, thereby drying the upper surface of the substrate.

However, in the above-described drying method, particles contained in the processing liquid appear on the upper surface of the substrate, resulting in the possibility that the particles may occur on a front surface (surface to be processed) of the substrate after drying.

Therefore, an object of the present invention is to provide a substrate processing method and a substrate processing apparatus which are capable of drying an upper surface of a substrate, while reducing or preventing occurrence of particles.

Solution to Problem

The present invention provides a substrate processing method which includes a substrate holding step which holds a substrate horizontally, a liquid film forming step in which a processing liquid is supplied to an upper surface of the substrate to form a liquid film of the processing liquid which covers the upper surface of the substrate, a vapor atmosphere filling step in which a vapor atmosphere that contains vapor of a low surface tension liquid whose lower surface tension than the processing liquid is filled around the liquid film of the processing liquid, a thin film region forming step in which, in parallel with the vapor atmosphere filling step, the substrate is rotated at a predetermined thin film region forming speed, without spraying of a gas to the substrate, to remove partially the processing liquid, thereby forming a thin film region on the liquid film of the processing liquid, a thin film region expanding step in which, in parallel with the vapor atmosphere filling step, the thin film region is expanded to an outer circumference of the substrate, and a thin film removing step in which the thin film is removed from the upper surface after expansion of the thin film to an entire area on the upper surface by the thin film region expanding step.

According to the above-described method, the substrate is raised in rotational speed, while a vapor atmosphere which contains vapor of the low surface tension liquid (hereinafter, simply referred to as "vapor atmosphere" and this also applies to this paragraph) is filled around an entire area on the liquid film of the processing liquid which covers the upper surface of the substrate, by which the processing liquid at a portion of the liquid film is subjected to a centrifugal force resulting from rotation of the substrate, pressed and expanded outward in a radial direction. As a result, the liquid film at the portion is decreased in thickness to form a thin film of the processing liquid.

Since the vapor atmosphere is kept around the thin film of the processing liquid, a large amount of the low surface tension liquid is dissolved into the thin film of the processing liquid and, therefore, the thin film of the processing liquid contains the low surface tension liquid at a high concentration. Since the vapor atmosphere is kept around an entire surface on the upper surface of the substrate, vapor of the low surface tension liquid will not undergo progressive diffusion. As a result, progressive evaporation of the low surface tension liquid contained in the thin film is reduced or prevented. Therefore, it is impossible to completely remove all the processing liquid at the portion of the liquid film of the processing liquid, by which the thin film of the processing liquid is stored at the portion. That is, the thin film region is formed at the portion.

Then, while the vapor atmosphere is kept around an entire area on the liquid film of the processing liquid which covers the upper surface of the substrate, the thin film region forming step and the thin film region expanding step are sequentially executed. Therefore, irrespective of an expansion situation at the thin film region, until complete expansion of the thin film region, the vapor atmosphere is kept around a portion close to (hereinafter, referred to as "boundary-close portion") a boundary between the liquid film of the processing liquid and the thin film of the processing liquid (hereinafter, referred to as "boundary") and around the thin film of the processing liquid.

When the substrate is rotated in a state that the vapor atmosphere is kept around the boundary-close portion on the liquid film of the processing liquid and the thin film of the processing liquid, due to a difference in the low surface tension liquid in concentration based on a difference in local thickness between the liquid film of the processing liquid and the thin film of the processing liquid which are mutually communicated, there occurs the Marangoni convection which flows in a direction from the thin film of the processing liquid via the boundary-close portion to the inside of the liquid film of the processing liquid. Therefore, it is possible to continuously cause the Marangoni convection which flows from the thin film of the processing liquid to the inside of the liquid film of the processing liquid over an entire period of time during the thin film region forming step and the thin film region expanding step.

Therefore, particles contained at the boundary-close portion of the liquid film of the processing liquid are subjected to the Marangoni convection and move in a direction separating from the boundary. Therefore, the particles are taken into the liquid film of the processing liquid. In association with expansion of the thin film region, the boundary moves outward of the substrate in a radial direction. However, the thin film region expands, with the particles taken into the liquid film of the processing liquid. Then, the particles contained in the liquid film of the processing liquid are expelled from the upper surface of the substrate, together with the liquid film of the processing liquid, without appearing on the thin film region. Thereafter, the thin film is removed from the upper surface of the substrate to dry the upper surface of the substrate.

Thereby, after the substrate has been dried, no particles will remain on the upper surface of the substrate. Consequently, it is possible to dry an entire surface on the upper surface of the substrate, while reducing or preventing occurrence of the particles.

Further, since the thin film contains a large amount of the low surface tension liquid, it is also possible to reduce occurrence of a water mark after drying.

In one preferred embodiment of the present invention, the above-described method further includes a shielding step in which a space including an upper space of the substrate is made into a shielded state which is kept shielded from the outside. And, the vapor atmosphere filling step is executed by supplying the gas to the space after the shielding step.

According to the above-described method, a space including the upper space of the substrate is made into a shielded state, by which the space is hardly affected by disturbance of an external atmosphere. The gas is supplied to the space, thus making it possible to fill the vapor atmosphere around the liquid film of the processing liquid.

The above-described method may further include an open and high-speed rotation step in which the substrate is rotated at a predetermined high rotational speed, while the space is opened to the outside.

According to the above-described method, the space is opened to the outside, by which a fresh gas is brought into contact with the upper surface of the substrate. Therefore, diffusion of vapor of the processing liquid proceeds at various sites on the upper surface of the substrate and, as a result, evaporation of the processing liquid proceeds at these various sites. Then, the substrate is rotated at a high speed, by which the processing liquid on the upper surface of the substrate can be spun off. Thereby, the thin film of the organic solvent can be completely removed from the upper surface of the substrate to dry the upper surface of the substrate.

Further, the above-described method may include a puddle step in which, in parallel with the liquid film forming step, the substrate is made into a stationary state or the substrate is rotated around the rotation axis at a puddle speed.

According to the above-described method, the puddle step is executed in parallel with the liquid film forming step, by which the liquid film of the processing liquid formed on the upper surface of the substrate can be large in thickness at the boundary-close portion. If the liquid film of the processing liquid is kept large in thickness at the boundary-close portion, the liquid film of the processing liquid and the thin film of the processing liquid which are mutually communicated can be kept large in concentration gradient of the low surface tension liquid in the thin film region expanding step. It is, thereby, possible to intensify the Marangoni convection which occurs in the liquid film of the processing liquid.

The thin film region expanding step may include a first high-speed rotation step which rotates the substrate at a first high speed which is faster than the thin film region forming speed.

According to the above-described method, since the substrate is rotated at a high speed upon execution of a dried region expanding step, the substrate is subjected to a strong centrifugal force. Therefore, this centrifugal force is able to make more conspicuous a difference in film thickness at a portion close to an interface with the liquid film of the processing liquid. Thereby, it is possible to keep large a concentration gradient of the low surface tension liquid occurring inside the portion close to the interface with the liquid film of the processing liquid. Consequently, it is possible to further intensify the Marangoni convection occurring inside the portion close to the interface with the liquid film of the processing liquid.

Further, the thin film removing step may include a second high-speed rotation step in which the substrate is rotated at a second high speed which is faster than the thin film region forming speed and an atmosphere replacement step in which, in parallel with the second high-speed rotation step, the atmosphere around the upper surface of the substrate is replaced from the vapor atmosphere with an atmosphere of a gas other than the low surface tension liquid.

According to the above-described method, in a state that the atmosphere around the upper surface of the substrate is replaced with an atmosphere of a gas other than the low surface tension liquid, the substrate is rotated at a high speed. In this case, since the fresh gas which is brought into contact with the upper surface of the substrate, diffusion of the low surface tension liquid proceeds at various sites on the upper surface of the substrate, and a thin film which contains the low surface tension liquid undergoes progressive evaporation. Therefore, the thin film can be spun off by high speed rotation of the substrate to dry the upper surface of the substrate.

The processing liquid may include water and the low surface tension liquid may include an organic solvent.

According to the above-described method, while a vapor atmosphere which contains organic solvent vapor (hereinafter, simply referred to as "organic solvent vapor atmosphere," and this also applies to this paragraph) is kept around an entire area on the liquid film of water which covers the upper surface of the substrate, the substrate is raised in rotational speed, by which water at a portion of the liquid film is subjected to a centrifugal force resulting from rotation of the substrate, pressed and expanded outward in a radial direction. As a result, the liquid film at the portion is decreased in thickness to form a thin film of water.

Since the vapor atmosphere is kept around the thin film of water, a large amount of an organic solvent is dissolved into the thin film of water, the thin film of water contains the organic solvent at a high concentration. The organic solvent vapor atmosphere is kept around an entire surface on the upper surface of the substrate and, therefore, the organic solvent vapor does not undergo progressive diffusion. As a result, it is possible to reduce or prevent progressive evaporation of the organic solvent contained in the thin film. Therefore, water is not completely removed at the portion of the liquid film of water and the thin film of water is stored at the portion. That is, a thin film region is formed at the portion concerned.

Then, the thin film region forming step and the thin film region expanding step are sequentially executed, while the organic solvent vapor atmosphere is kept around an entire area on the liquid film of water which covers the upper surface of the substrate. Therefore, irrespective of an expansion situation at the thin film region, until complete expansion of the thin film region, the organic solvent vapor atmosphere is kept around a portion close to the boundary between the liquid film of water and the thin film of water (boundary-close portion) and also around the thin film of water.

In a state that the organic solvent vapor atmosphere is kept around the boundary-close portion of the liquid film of water and around the thin film of water, the substrate is rotated, by which, due to a difference in the organic solvent in concentration based on a difference in local thickness between the liquid film of water and the thin film of water which are mutually communicated, there occurs the Marangoni convection which flows from the thin film of water via the boundary-close portion to the inside of the liquid film of water. Therefore, over an entire period of time during the thin film region forming step and the thin film region expanding step, it is possible to continuously cause the Marangoni convection which flows from the thin film of water to the inside of the liquid film of water.

Therefore, particles contained in the boundary-close portion of the liquid film of water are subjected to the Marangoni convection and move in a direction separating from the boundary. Thus, the particles are taken into the liquid film of water. In association with expansion of the thin film region, the boundary moves outward of the substrate in a radial direction. However, the thin film region is expanded, with the particles taken into the liquid film of water. Then, the particles contained in the liquid film of water are expelled from the upper surface of the substrate together with the liquid film of water, without appearing at the thin film region. Thereafter, the thin film is removed from the upper surface of the substrate to dry the upper surface of the substrate.

Thereby, after the substrate is dried, no particles will remain on the upper surface of the substrate. Consequently, it is possible to dry an entire surface on the upper surface of the substrate, while preventing or reducing occurrence of the particles.

Further, since the thin film contains a large amount of an organic solvent, it is also possible to reduce occurrence of a water mark after drying.

Still further, the present invention provides a substrate processing apparatus which includes a substrate holding unit for holding a substrate horizontally, a processing liquid supplying unit for supplying a processing liquid to an upper surface of the substrate, a gas supplying unit for supplying a gas that contains vapor of a low surface tension liquid whose lower surface tension than water around the upper surface of the substrate, and a controller which controls the processing liquid supplying unit and the gas supplying unit, in which the controller executes a liquid film forming step in which the processing liquid is supplied to the upper surface of the substrate to form a liquid film of the processing liquid which covers the upper surface of the substrate, a vapor atmosphere filling step in which a vapor atmosphere which contains vapor of the low surface tension liquid is filled around the liquid film of the processing liquid, a thin film region forming step in which, in parallel with the vapor atmosphere filling step, the substrate is rotated at a predetermined thin film region forming speed, without spraying of a gas to the substrate, to partially remove the processing liquid, thereby forming a thin film region on a liquid film of the processing liquid, and a thin film region expanding step in which, in parallel with the vapor atmosphere filling step, the thin film region is expanded to an outer circumference of the substrate.

According to the above-described configuration, while the vapor atmosphere that contains vapor of the low surface tension liquid is filled around an entire area on the liquid film of the processing liquid which covers the upper surface of the substrate, the substrate is raised in rotational speed, by which the processing liquid at a portion of the liquid film is subjected to a centrifugal force resulting from rotation of the substrate, pressed and expanded outward in a radial direction. As a result, the liquid film at the portion is decreased in thickness to form a thin film of the processing liquid.

Since the vapor atmosphere is kept around the thin film of the processing liquid, a large amount of the low surface tension liquid is dissolved into the thin film of the processing liquid and therefore, the thin film of the processing liquid contains the low surface tension liquid at a high concentration. Since the vapor atmosphere is kept around an entire surface on the upper surface of the substrate, vapor of the low surface tension liquid will not undergo progressive diffusion. As a result, progressive evaporation of the low surface tension liquid contained in the thin film is reduced or prevented. Therefore, it is impossible to remove completely all the processing liquid at the portion of the liquid film of the processing liquid, and the thin film of the processing liquid is stored at the portion. That is, a thin film region is formed at the portion concerned.

Then, the thin film region forming step and the thin film region expanding step are sequentially executed, while the vapor atmosphere is kept around an entire area on the liquid film of the processing liquid which covers the upper surface of the substrate. Therefore, irrespective of an expansion situation of the thin film region, until complete expansion of the thin film region, the vapor atmosphere is kept around a portion close to (hereinafter, referred to as "boundary-close portion") a boundary between the liquid film of the processing liquid and the thin film of the processing liquid (hereinafter, referred to as "boundary") and around the thin film of the processing liquid.

In a state that the vapor atmosphere is kept around the boundary-close portion on the liquid film of the processing liquid and around the thin film of the processing liquid, the substrate is rotated, by which, due to a difference in the low surface tension liquid in concentration based on a difference in local thickness between the liquid film of the processing liquid and the thin film of processing liquid which are mutually communicated, there occurs the Marangoni convection which flows from the thin film of the processing liquid via the boundary-close portion to the inside of the liquid film of the processing liquid. Therefore, over an entire period of time during the thin film region forming step and the thin film region expanding step, it is possible to continuously cause the Marangoni convection flowing from the thin film of the processing liquid to the inside of the liquid film of the processing liquid.

Therefore, particles contained in the boundary-close portion of the liquid film of the processing liquid are subjected to the Marangoni convection and move in a direction separating from the boundary. Thus, the particles are taken into the liquid film of the processing liquid. In association with expansion of the thin film region, the boundary moves outward of the substrate in a radial direction. However, the thin film region is expanded, with the particles taken into the liquid film of the processing liquid. Then, the particles contained in the liquid film of the processing liquid are expelled from the upper surface of the substrate, together with the liquid film of the processing liquid, without appearing at the thin film region. Thereafter, the thin film is removed from the upper surface of the substrate to dry the upper surface of the substrate.

Thereby, after the substrate is dried, no particles will remain on the upper surface of the substrate. Consequently, it is possible to dry an entire surface on the upper surface of the substrate, while reducing or preventing occurrence of the particles.

Further, since the thin film contains a large amount of the low surface tension liquid, it is also possible to reduce occurrence of a water mark after drying.

In one preferred embodiment of the present invention, the substrate processing apparatus further includes a closed chamber which has an inner space kept closed from the outside and houses the substrate holding unit at the inner space.

According to the above-described configuration, a substrate is housed at the inner space of the closed chamber, thus making it possible to realize a vapor atmosphere at an entire area on the inner space of the closed chamber. Therefore, it is possible to reliably retain the vapor atmosphere around an entire surface on the upper surface of the substrate.

Further, only existence of a liquid which is a low surface tension liquid inside the inner space of the closed chamber enables to realize a vapor atmosphere at the inner space of the closed chamber.

Still further, the first gas supplying unit may include an internal gas supplying unit which supplies the gas to the inner space.

In addition, the gas supplying unit may include an internal gas supplying unit which supplies the gas to the inner space.

According to the above-described configuration, the gas which contains vapor of the low surface tension liquid is supplied to the inner space from the internal gas supplying unit, by which a vapor atmosphere can be realized at an entire area on the inner space of the closed chamber. It is, thereby, possible to easily provide a configuration which keeps the vapor atmosphere around an entire surface on the upper surface of the substrate.

Further, the gas supplying unit may further include a nozzle for discharging the liquid of the low surface tension liquid and a low surface tension liquid supplying unit for supplying the liquid of the low surface tension liquid to the nozzle. The substrate processing apparatus may further include a retaining container capable of receiving the liquid of the low surface tension liquid discharged from the nozzle to retain the liquid.

According to the above-described method, vapor of the low surface tension liquid resulting from evaporation of the liquid of the low surface tension liquid stored at the retaining container can be used to apply a vapor atmosphere to an entire area on the inner space of the closed chamber. It is, thereby, possible to easily provide a configuration which keeps the vapor atmosphere around an entire surface on the upper surface of the substrate.

According to the above-described configuration, vapor of the low surface tension liquid resulting from evaporation of the liquid of the low surface tension liquid retained in the retaining container can be used to apply a vapor atmosphere to an entire area on the inner space of the closed chamber. It is, thereby, possible to easily provide a configuration which keeps the vapor atmosphere around an entire surface on the upper surface of the substrate.

The above-described substrate processing apparatus may further include a processing chamber which houses the substrate holding unit and a facing member which has a facing surface to the upper surface of the substrate. The gas supplying unit may include a gas discharge port which is opened on the facing surface to discharge the gas.

According to the above-described configuration, vapor of the low surface tension liquid discharged from the gas discharge port is supplied to a space between the facing surface and the upper surface of the substrate. A vapor atmosphere is realized at an entire area on the space, by which the space between the facing surface and the upper surface of the substrate can be kept shielded from the outside thereof to keep the vapor atmosphere around an entire surface on the upper surface of the substrate.

The facing member may be provided with a facing peripheral portion which faces a peripheral portion of the upper surface of the substrate and which forms a narrow clearance between the facing peripheral portion and the peripheral portion of the upper surface which is narrower than a clearance between the central portion of the facing surface and the central portion of the upper surface of the substrate.

According to the above-described configuration, a narrow clearance is formed between a facing peripheral portion of the facing member and a peripheral portion of the upper surface of the substrate. Therefore, vapor of the low surface tension liquid supplied to the space between the facing surface and the upper surface of the substrate is less likely to be expelled from the space. Therefore, it is possible to reduce more favorably leakage of vapor of the low surface tension liquid from the space. It is, thereby, possible to keep the vapor atmosphere more reliably around an entire surface on the upper surface of the substrate.

The plurality of gas discharge ports may be disposed separately on the facing surface.

According to the above-described configuration, since the plurality of gas discharge ports are disposed separately, it is possible to uniformly supply the gas from the gas discharge ports to the liquid film of the processing liquid on the substrate. In this case, it is also possible to make mutually equal a discharge pressure of the gas from each of the gas discharge ports. It is, thereby, possible to reliably prevent the liquid film of the processing liquid from being pressed by the discharge pressure of the gas to undergo deformation. In other words, separate arrangement of the plurality of gas discharge ports is a mode in which the ports are provided so as not to be locally placed on the upper surface of the substrate.

Further, the substrate processing apparatus may further include an lifting unit which elevates and lowers the facing member. The controller may control the lifting unit to elevate and lower the height of the lifting unit according to a change in rotational speed of the substrate.

In a state that the liquid film of the processing liquid is formed on the upper surface of the substrate, the substrate is raised in rotational speed, by which the processing liquid is decreased in thickness of the liquid film. Therefore, even when a space between the upper surface of the substrate and the facing surface is equal in volume, a space between the upper surface of the liquid film of the processing liquid and the facing surface is increased in volume only by such an extent that the liquid film of the processing liquid is made thinner. In this case, there is a possibility that the low surface tension liquid contained at the space between the upper surface of the substrate and the facing surface may be decreased in concentration.

According to the above-described configuration, the height of the lifting unit is elevated and lowered according to a change in rotational speed of the substrate. Where the substrate is raised in rotational speed, the lifting unit is lowered, and where the substrate is decreased in rotational speed, the lifting unit is elevated. In this case, it is, thereby, possible to keep the vapor of the low surface tension liquid contained at the space between the upper surface of the substrate and the facing surface high in concentration. Therefore, it is possible to reduce progressive evaporation of the thin film which constitutes the thin film region and thereby to prevent elimination of the thin film.

The above and other objects, features and effects of the present invention will become more apparent from the following detailed description of the preferred embodiments with reference to the attached drawings.

BRIEF DESCRIPTION OF DRAWINGS

FIG. 6A is an illustrative cross sectional view for describing a mode of a puddle rinse step (T1 in FIG. 5).

FIG. 10 is a drawing which shows a flow distribution model on a gas-liquid-solid interface with respect to a liquid film of water on the upper surface of the substrate according to a reference mode.

FIG. 16 is a time chart for describing a rinse step (S3) and a spin drying step (S4) which are executed by the substrate processing apparatus according to the third preferred embodiment of the present invention.

DESCRIPTION OF EMBODIMENTS

Figure 1:
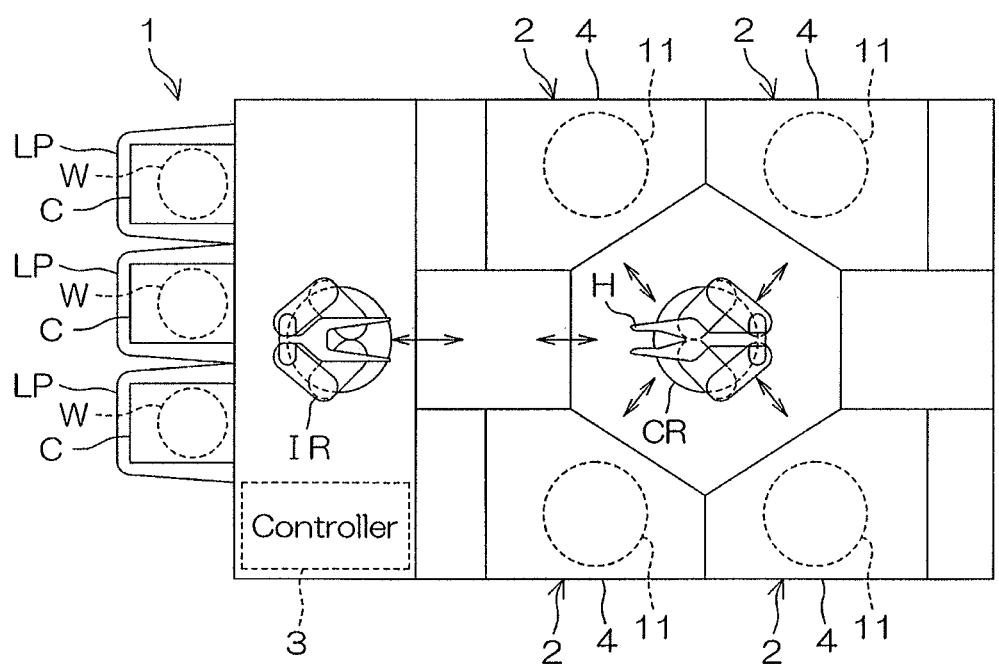
FIG. 1 is an illustrative plan view for describing a layout of the inside a substrate processing apparatus according to a first preferred embodiment of the present invention.

FIG. 1 is an illustrative plan view for describing a layout of the inside a substrate processing apparatus of a first preferred embodiment of the present invention. A substrate processing apparatus 1 is a single substrate processing type apparatus which processes substrates W such as silicon wafers one at a time. In this preferred embodiment, the substrate W is a circular-plate shaped substrate. The substrate processing apparatus 1 includes a plurality of processing units 2 which process the substrates W by a processing liquid, a load port LP on which a carrier C for housing the plurality of substrates W processed by the processing units 2 is placed, a transfer robot IR and a transfer robot CR which transfer a substrate W between the load port LP and the processing unit 2, and a controller 3 which controls the substrate processing apparatus 1. The transfer robot IR transfers a substrate W between the carrier C and the transfer robot CR. The transfer robot CR transfers a substrate W between the transfer robot IR and the processing unit 2. Each of the plurality of processing units 2 has, for example, a similar configuration.

Figure 2:
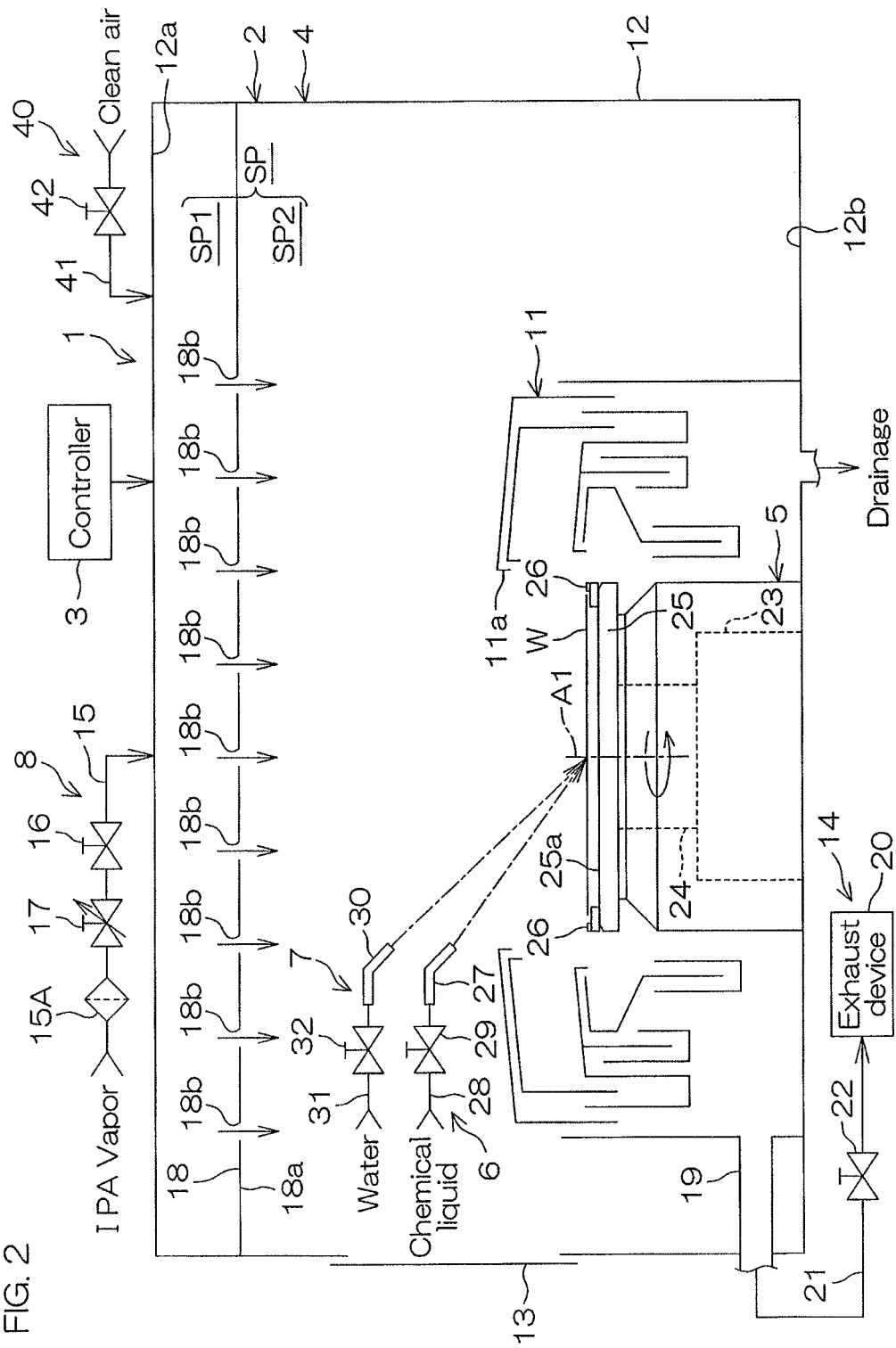
FIG. 2 is an illustrative cross sectional view for describing a configuration example of a processing unit provided at the substrate processing apparatus.

FIG. 2 is an illustrative cross sectional view for describing a configuration example of the processing unit 2.

The processing unit 2 includes a box-shaped processing chamber (closed chamber) 4 which is provided with an inner space SP, a spin chuck (substrate holding unit) 5 which holds one sheet of a substrate W in a horizontal posture inside the processing chamber to rotate the substrate W around a perpendicular rotation axis A1 passing through the center of the substrate W, a chemical liquid supplying unit 6 which supplies a chemical liquid to the upper surface of the substrate W held by the spin chuck 5, a water supplying unit (processing liquid supplying unit) 7 which supplies water (processing liquid) to the upper surface of the substrate W held by the spin chuck 5, a first organic solvent vapor supplying unit (internal gas supplying unit, gas supplying unit) 8 which supplies vapor of IPA (IPA vapor) as one example of organic solvent vapor of the low surface tension liquid to the inner space SP, and a cylindrical processing cup 11 which surrounds the spin chuck 5.

The processing chamber 4 includes a box-shaped partition wall 12 which houses the spin chuck 5, etc., an air blowing unit 40 which feeds clean air (gas atmosphere other than the low surface tension liquid) to the inside of the partition wall 12 (corresponding to the inside of the processing chamber 4) from an upper portion of the partition wall 12, a shutter 13 which opens and closes a carrying-out/carrying-in port provided on the partition wall 12, and an exhaust unit 14 which expels the gas inside the processing chamber 4 from a lower portion of the partition wall 12.

The air blowing unit 40 is disposed above the partition wall 12 and mounted on a ceiling of the partition wall 12 to feed clean air into the processing chamber 4 from the ceiling. The air blowing unit 40 includes clean air pipe 41 through which clean air is circulated and a clean air valve 42 for switching between supply and supply stoppage of organic solvent vapor (IPA vapor) from the clean air pipe 41 to the inner space SP. A downstream end of the clean air pipe 41 is connected to the inner space SP. When the clean air valve 42 is opened, clean air is fed to the inner space SP through the clean air pipe 41.

The first organic solvent vapor supplying unit 8 is disposed above the partition wall 12 and mounted on the ceiling of the partition wall 12. The first organic solvent vapor supplying unit 8 includes first organic solvent vapor pipe 15 through which organic solvent vapor is circulated. A downstream end of the first organic solvent vapor pipe 15 is connected to the inner space SP. The first organic solvent vapor supplying unit 8 further includes a first organic solvent vapor valve 16 for switching between supply and supply stoppage of organic solvent vapor from the first organic solvent vapor pipe 15 to the inner space SP, a first flow control valve 17 for adjusting a valve aperture of the first organic solvent vapor pipe 15 to adjust a flow rate of the organic solvent vapor supplied to the inner space SP, and a first filter 15A for catching dust and dirt contained in the organic solvent vapor which is circulated through the first organic solvent vapor pipe 15. Although not illustrated, the first flow control valve 17 includes a valve body provided with a valve seat, a valve body for opening and closing the valve seat, and an actuator which moves the valve body between an opened position and a closed position. This also applies to other flow control valves.

When the first organic solvent vapor valve 16 is opened, organic solvent vapor (clean organic solvent vapor from which dust and dirt are removed) is fed to the inner space SP through the first organic solvent vapor pipe 15.

The processing chamber 4 includes a rectifying plate 18 which rectifies the gas (clean air or organic solvent vapor) supplied to the inner space SP by the first organic solvent vapor supplying unit 8. The rectifying plate 18 is disposed at the inner space SP and, specifically, disposed at the height between the first organic solvent vapor supplying unit 8 and the spin chuck 5. The rectifying plate 18 is held in a horizontal posture. The rectifying plate 18 divides the inside of the partition wall 12 into a space SP1 above the rectifying plate 18 and a space SP 2 below the rectifying plate 18. The upper space SP1 between a ceiling surface 12a of the partition wall 12 and the rectifying plate 18 is a diffusion space for diffusing the supplied gas (clean air or organic solvent vapor). The lower space SP2 between the rectifying plate 18 and a floor surface 12b of the partition wall 12 is a processing space for processing a substrate W. The upper space SP1 is smaller in height than the lower space SP2. A lower surface 18a of the rectifying plate 18 includes a facing portion which overlaps with the spin chuck in a plan view. The rectifying plate 18 is a porous plate on which a plurality of through holes 18b penetrating in a vertical direction are formed all over the plate.

In a state that the first organic solvent vapor valve 16 is closed, the clean air valve 42 is opened, by which clean air is fed to the upper space SP1. The clean air valve 42 is opened continuously to fill the upper space SP1 with clean air and, therefore, the clean air passes through the through holes 18b, flowing downward from an entire area on the rectifying plate 18. Thereby, a uniform flow of the clean air downward from an entire area on the rectifying plate 18 is formed at the lower space SP2.

On the other hand, in a state that the clean air valve 42 is closed, the first organic solvent vapor valve 16 is opened, by which organic solvent vapor is fed to the upper space SP1. The first organic solvent vapor valve 16 is opened continuously to fill the upper space SP1 with the organic solvent vapor and, therefore, the organic solvent vapor passes through the through holes 18b and flows downward from an entire area on the rectifying plate 18. Thereby, a uniform flow of the organic solvent vapor downward from an entire area on the rectifying plate 18 is formed at the lower space SP2.

The exhaust unit 14 includes an exhaust duct 19 connected to the inside of the processing cup 11, an exhaust device 20 such as a suction device for sucking an atmosphere at the inner space SP of the processing chamber 4 via the exhaust duct 19, exhaust pipe 21 which connects the exhaust duct 19 with the exhaust device 20, and an exhaust valve 22 for opening and closing the exhaust pipe 21. In a state that the exhaust valve 22 is opened, the atmosphere at the inner space SP (lower space SP2) is expelled outward of the processing chamber 4 to develop also a downflow (descending flow) at the inner space SP (lower space SP2). On the other hand, in a state that the exhaust valve 22 is closed, no atmosphere at the inner space SP (lower space SP2) is expelled outward of the processing chamber 4.

In a state that the clean air valve 42 is closed and the exhaust valve 22 is also closed, by which the inner space SP is closed from the outside to develop a closed state. The processing chamber 4 functions as a closed chamber which is kept blocked from the outside.

As the spin chuck 5, adopted is a clamping type chuck which clamps a substrate W in a horizontal direction to hold the substrate W horizontally. Specifically, the spin chuck 5 includes a spin motor 23, a spin shaft 24 formed integrally with a driving shaft of the spin motor 23, and a circular-plate shaped spin base 25 which is mounted substantially horizontally at an upper end of the spin shaft 24.

The spin base 25 includes a horizontally circular upper surface 25a having an outer diameter larger than that of a substrate W. A plurality of (three or more, for example, six) clamping members 26 are disposed at a peripheral portion of the upper surface 25a. The plurality of clamping members 26 are disposed, with appropriate intervals kept, at the peripheral portion of the upper surface of the spin base 25 on a circumference corresponding to an outer circumferential shape of the substrate W.

The chemical liquid supplying unit 6 includes a chemical liquid nozzle 27. The chemical liquid nozzle 27 is a straight nozzle which discharges, for example, a liquid in a state of continuous flow and fixedly disposed above the spin chuck 5, with a discharge port thereof pointed to a central portion of the upper surface of the substrate W. Chemical liquid pipe 28 to which a chemical liquid is supplied from a chemical liquid supply source is connected to the chemical liquid nozzle 27. A chemical liquid valve 29 for switching between supply and supply stoppage of the chemical liquid from the chemical liquid nozzle 27 is placed at a middle portion of the chemical liquid pipe 28. When the chemical liquid valve 29 is opened, the chemical liquid in a state of continuous flow supplied from the chemical liquid pipe 28 to the chemical liquid nozzle 27 is discharged from a discharge port provided at a lower end of the chemical liquid nozzle 27. Further, when the chemical liquid valve 29 is closed, supply of the chemical liquid from the chemical liquid pipe 28 to the chemical liquid nozzle 27 is stopped.

The chemical liquid is, for example, an etching liquid or a cleaning solution. More specifically, the chemical liquid may be hydrofluoric acid, SC1 (mixture of ammonia and hydrogen peroxide solution), SC2 (mixture of hydrochloric acid and hydrogen peroxide solution), ammonium fluoride, buffered hydrofluoric acid (mixture solution of hydrofluoric acid and ammonium fluoride), etc.

The water supplying unit 7 includes a water nozzle 30. The water nozzle 30 is a straight nozzle which discharges, for example, a liquid in a state of continuous flow and fixedly disposed above the spin chuck 5, with a discharge port thereof pointed to a central portion of the upper surface of the substrate W. Water pipe 31 to which water is supplied from a water supply source is connected to the water nozzle 30. A water valve 32 for switching between supply and supply stoppage of water from the water nozzle 30 is placed at a middle portion of the water pipe 31. When the water valve 32 is opened, water in a state of continuous flow which has been supplied from the water pipe 31 to the water nozzle 30 is discharged from a discharge port provided at a lower end of the water nozzle 30. Further, when the water valve 32 is closed, supply of water from the water pipe 31 to the water nozzle 30 is stopped. The water supplied to the water nozzle 30 is, for example, deionized water (DIW) but is not limited to DIW and may be any one of carbonated water, electrolytic ion water, hydrogen water, ozone water and hydrochloric acid water with a diluted concentration (for example, 10 to 100 ppm).

It is noted that the chemical liquid nozzle 27 and the water nozzle 30 are not necessarily disposed fixedly to the spin chuck 5. There may be adopted what-is-called a mode of scan nozzle in which, for example, these nozzles are individually mounted on an arm which is allowed to sway on a horizontal plane above the spin chuck 5 and the arm is allowed to sway, thereby scanning a position at which a processing liquid (chemical liquid or water) is placed on the upper surface of the substrate W.

As shown in FIG. 2, the processing cup 11 is disposed outside (in a direction away from the rotation axis A1) from the substrate W held by the spin chuck 5. The processing cup 11 surrounds the spin base 25. In a state that the spin chuck 5 rotates the substrate W, a processing liquid is supplied to the substrate W, by which the processing liquid supplied to the substrate W is spun off around the substrate W. When the processing liquid is supplied to the substrate W, an upper end portion 11a of the processing cup 11 which is opened upward is disposed above from the spin base 25. Therefore, the processing liquid such as a chemical liquid or water expelled around the substrate W is received by the processing cup 11. Then, the processing liquid received by the processing cup 11 is fed to a collection device or a drainage device (not illustrated).

Figure 3:
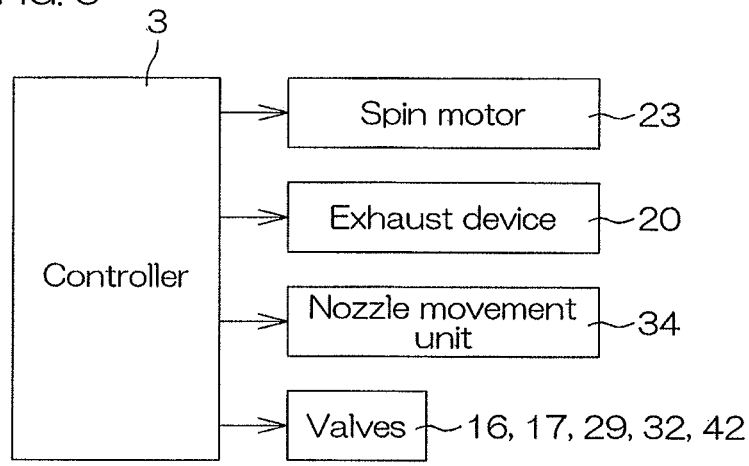
FIG. 3 is a block diagram for describing an electrical configuration of a major portion of the substrate processing apparatus.

FIG. 3 is a block diagram for describing an electrical configuration of a major portion of the substrate processing apparatus 1.

The controller 3 controls motions of the spin motor 23, the exhaust device 20, the first nozzle movement unit 34, etc., according to a predetermined program. The controller 3 also controls motions of opening and closing the chemical liquid valve 29, the water valve 32, the first organic solvent vapor valve 16, the first flow control valve 17, the clean air valve 42, etc.

Figure 4:
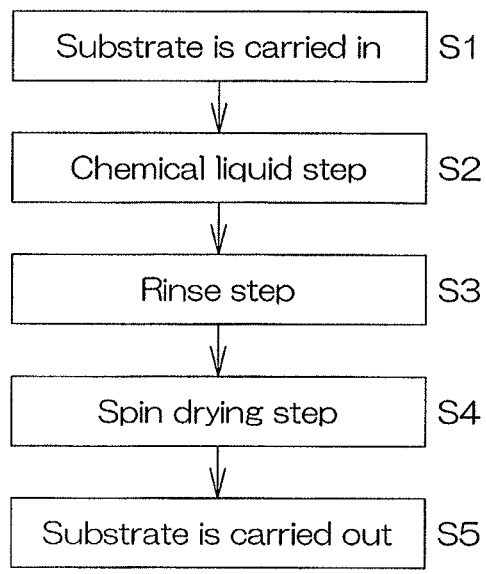
FIG. 4 is a flowchart for describing one example of substrate processing by the substrate processing apparatus.
Figure 5:
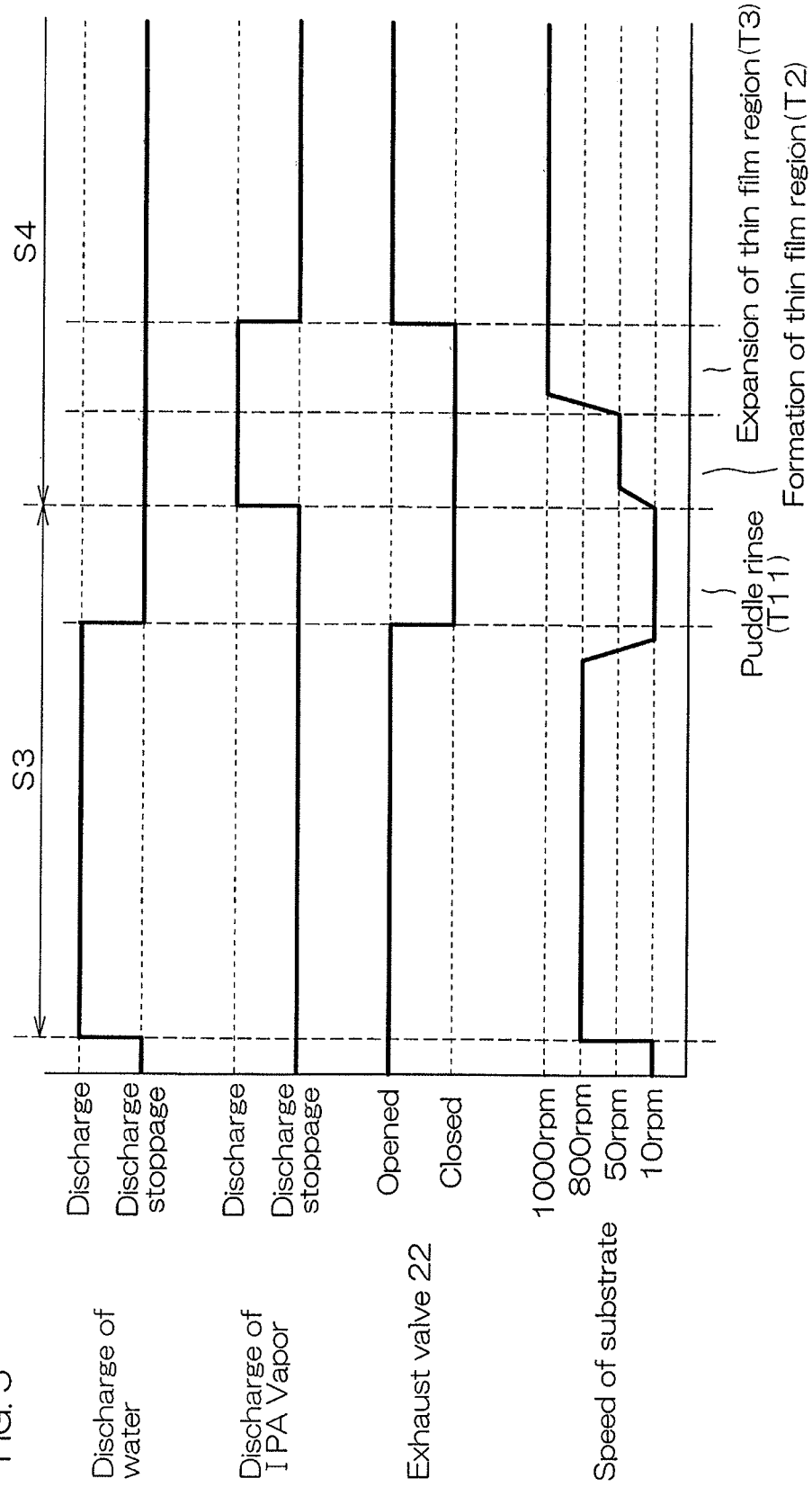
FIG. 5 is a time chart for describing details of a rinse step (S3 in FIG. 4) and a spin drying step (S4 in FIG. 4) which are executed in the substrate processing apparatus.

FIG. 4 is a flowchart for describing one example of substrate processing by the substrate processing apparatus 1. FIG. 5 is a time chart for describing a rinse step (S3) and a spin drying step (S4) executed by the substrate processing apparatus 1. FIGS. 6A to 6E are illustrative drawings for describing puddle rinse processes respectively (liquid film forming step, vapor atmosphere filling step and puddle step) T1, a thin film region forming step T2 and a thin film region expanding step (high-speed rotation step) T3.

The substrate processing will be described with reference to FIG. 1 to FIG. 6E.

A substrate W which is not yet processed is carried in the processing unit 2 by the transfer robots IR, CR from the carrier C, carried in the interior of the processing chamber 4 and delivered to the spin chuck 5 in a state that the substrate W keeps a front surface thereof (a surface to be processed, for example, a pattern forming surface) pointed above, and the substrate W is held by the spin chuck 5 (S1: substrate carried-in step (substrate holding step)). Before the substrate is carried in, the first organic solvent vapor valve 16 is closed, the clean air valve 42 is opened and the exhaust valve 22 is also opened. Therefore, at the inner space SP (lower space SP2), a downflow (descending flow) of clean air is developed at the lower space SP2.

After the transfer robot CR has been retracted outside the processing unit 2, the controller 3 executes a chemical liquid step (Step S2). Specifically, the controller 3 drives the spin motor 23 to rotate the spin base 25 at a predetermined liquid processing speed (for example, about 800 rpm). The controller 3 also opens the chemical liquid valve 29. Thereby, a chemical liquid is supplied from the chemical liquid nozzle 27 to the upper surface of the substrate W in a rotation state. The supplied chemical liquid is fed to an entire area on the substrate W by a centrifugal force, thereby applying chemical liquid processing to the substrate W by using the chemical liquid. After elapse of a predetermined period of time from the start of discharge of the chemical liquid, the controller 3 closes the chemical liquid valve 29 to stop discharge of the chemical liquid from the chemical liquid nozzle 27.

Then, the controller 3 executes a rinse step (Step S3). The rinse step is a step in which a chemical liquid on the substrate W is replaced with water to remove the chemical liquid on the substrate W. Specifically, the controller 3 opens the water valve 32. Thereby, water is supplied from the water nozzle 30 to the upper surface of the substrate W in a rotation state. The supplied water is fed all over the substrate W by a centrifugal force. The chemical liquid adhered on the substrate W is washed away by the water.

After elapse of a predetermined period of time from the start of water supply, in a state that an entire area on the upper surface of the substrate W is covered with water, the controller 3 controls the spin motor 23 to reduce a rotational speed of the substrate W from a liquid processing speed to a puddle speed (low rotational speed from zero or about 40 rpm or less, for example, about 10 rpm) in stages. Thereafter, the rotational speed of the substrate W is kept at the puddle speed (puddle rinse step T1). Thereby, as shown in FIG. 6A, a liquid film of water covering an entire area on the upper surface of the substrate W is formed in a puddle shape on the upper surface of substrate W. In this state, a centrifugal force acting on the liquid film of water (liquid film of processing liquid) 50 on the upper surface of the substrate W is smaller than a surface tension acting between water and the upper surface of the substrate W, or the centrifugal force is substantially equal to the surface tension. The substrate W is decreased in rotational speed, by which the centrifugal force acting on water on the substrate W is weakened to result in a reduction in the amount of water expelled from the substrate W. Since the rinse step is executed after the chemical liquid step in which particles are removed from the upper surface of the substrate W by the chemical liquid, the particles may be contained in the liquid film of water 50. Further, in the puddle rinse step T1, water may be continuously supplied to the substrate W after formation of the puddle-shaped liquid film of water 50.

Further, the controller 3 closes the clean air valve 42 in synchronization with start of the puddle rinse step T1 and also opens the first organic solvent vapor valve 16. Thereby, supply of clean air to the inner space SP is stopped to start supply of organic solvent vapor to the inner space SP. Thereby, the organic solvent vapor is supplied via the through holes 18b (refer to FIG. 2) to the lower space SP2. The controller 3 also closes the exhaust valve 22. Thereby, the inner space SP of the processing chamber 4 is kept blocked from the outside and the processing chamber 4 serves as a closed chamber. In this state, the lower space SP2 (space which includes a space above the substrate W) is kept shielded from the outside of the processing chamber 4 (shielding step) and, therefore, the organic solvent vapor supplied to the lower space SP2 is fed to an entire area on the lower space SP2 and filled at the lower space SP2. As a result, it is possible to fill the organic solvent vapor atmosphere around the liquid film of water 50 on the substrate W (vapor atmosphere filling step).

The lower space SP2 which is kept shielded from an outer space is hardly affected by disturbance of an outer atmosphere. Therefore, the atmosphere which contains the organic solvent vapor at a high concentration (hereinafter, referred to as "organic solvent vapor atmosphere") is subsequently kept around an entire area on the upper surface of the substrate W. After formation of the puddle-shaped liquid film of water 50, the controller 3 closes the water valve 32 to stop discharge of water from the water nozzle 30. After the organic solvent vapor has been filled at the lower space SP2, the puddle rinse step T1 is completed (rinse step (S3)).

Figure 6B:
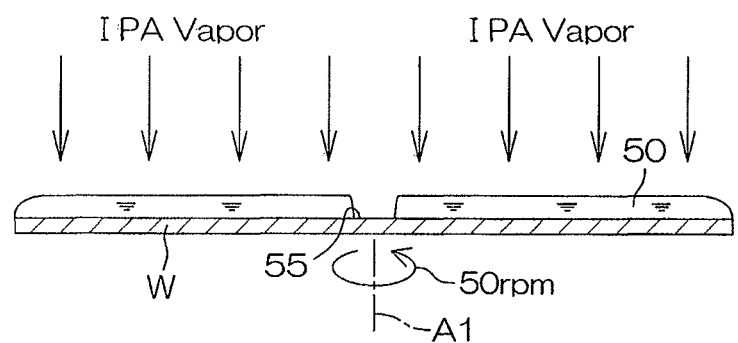
FIGS. 6B, 6C are each an illustrative cross sectional view for describing a mode of a thin film region forming step (T2 in FIG. 5) and that of a thin film region expanding step (T3 in FIG. 5).

Then, the controller 3 executes a spin drying step (Step S4). Specifically, the controller 3 first executes a thin film region forming step T2. The thin film region forming step T2 is, as shown in FIG. 6B, a step in which a circular thin film region 55 having an extremely-thin ultrathin film (thin film of water) 56 from which water is substantially removed (refer to FIG. 7) is formed at a central portion of the liquid film of water 50 on the substrate W. Specifically, the controller 3 controls the spin motor 23 to accelerate the substrate W up to a predetermined thin film region forming speed (for example, about 50 rpm). The rotational speed of the substrate W reaches the thin film region forming speed (for example, about 50 rpm), by which a relatively strong centrifugal force is applied to the liquid film of water 50 on the substrate W, and the water existing at a central portion of the upper surface of the substrate W is pressed outward in a radial direction, thereby, forming the circular thin film region 55 at the central portion of the upper surface of the substrate W. The thin film region forming speed is set at about 50 rpm but may be a rotational speed greater than the speed.

As described previously, the organic solvent vapor is filled at an entire area on the lower space SP2. Therefore, the liquid film of water 50 will not undergo any deformation by being pressed by a discharge pressure of the organic solvent vapor. Therefore, in the thin film region forming step T2, it is possible to keep the liquid film of water 50 (bulk 72) as thick as possible and also to keep a large difference in film thickness between the bulk 72 and the thin film region 55. It is, thereby, possible to intensify the Marangoni convection 65 occurring at an inner circumferential portion 70 of the liquid film of water.

After the thin film region forming step T2, a thin film region expanding step T3 is executed.

Figure 6C:
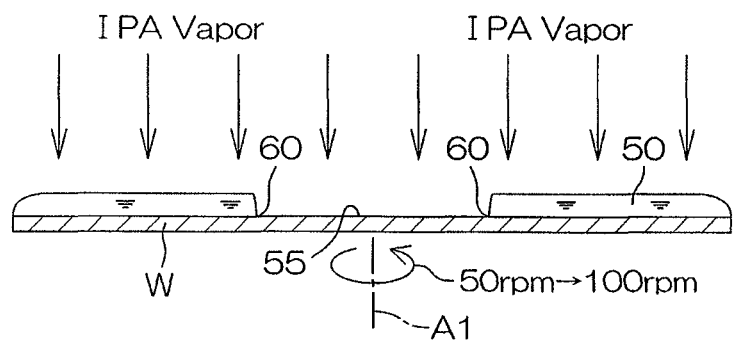
Figure 6D:
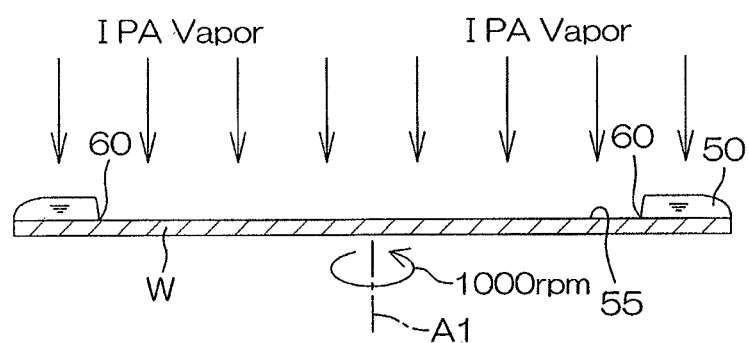
FIGS. 6D, 6E are each an illustrative cross sectional view for describing a mode of a thin film region expanding step (T3 in FIG. 5).
Figure 6E:
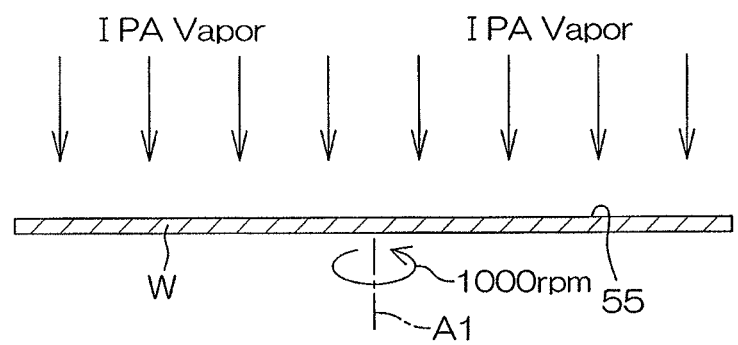

In the thin film region expanding step T3, the controller 3 controls the spin motor 23 to raise the rotational speed of the substrate W up to a predetermined drying speed (first high speed, second high speed, for example, 1000 rpm). In association with a rise in rotational speed of the substrate W, as shown in FIG. 6C and FIG. 6D, the thin film region 55 is expanded. Along with expansion of the thin film region 55, the boundary 60 between the liquid film of water 50 and the thin film region 55 moves outward of the substrate W in a radial direction. Then, as shown in FIG. 6E, the thin film region 55 is expanded to an entire area on the substrate W, by which the liquid film of water 50 is all expelled to outside the substrate W.

In the thin film region expanding step T3, the liquid film of water 50 is not subjected to a strong discharge pressure by the organic solvent vapor and will not undergo deformation. Therefore, it is possible to keep the liquid film of water 50 (bulk 72) as thick as possible and also to keep a large difference in film thickness between the bulk 72 and the thin film region 55. It is, thereby, possible to intensify the Marangoni convection 65 occurring at the inner circumferential portion 70 of the liquid film of water.

In the thin film region expanding step T3, the organic solvent on the central portion of the substrate W is about 300 ppm or more in concentration, the organic solvent on the peripheral portion of the substrate W is about 300 ppm or more in concentration, and the organic solvent on an intermediate position (between the central portion and the peripheral portion) of the substrate W is about 300 ppm or more in concentration.

Over an entire period of time during the thin film region expanding step T3, an organic solvent vapor is supplied continuously to the inner space SP from the first organic solvent vapor supplying unit 8. Therefore, over an entire period of time during the thin film region expanding step T3, the organic solvent vapor is kept on an entire area on the upper surface of the substrate W. Therefore, irrespective of an expansion situation of the thin film region 55, the atmosphere around the inner circumferential portion (boundary-close portion) 70 of the liquid film of water (a portion at which no ultrathin film 56 is formed, of the liquid film) can be continuously kept in an organic solvent vapor atmosphere.

After expansion of the thin film region 55 to an entire area on the upper surface of the substrate W, the controller 3 completes the thin film region expanding step T3. In association with completion of the thin film region expanding step T3, the controller 3 closes the first organic solvent vapor valve 16 to stop supply of the organic solvent vapor from the first organic solvent vapor supplying unit 8 to the inner space SP. Further, the controller 3 opens the clean air valve 42 and the exhaust valve 22 to develop a downflow (descending flow) of clean air at the inner space SP (lower space SP2). Thereby, the atmosphere at the inner space SP (lower space SP2) is replaced with clean air from the organic solvent vapor.

Thereafter, the controller 3 continues to rotate the substrate W, keeping the rotation at about 1000 rpm (thin film removing step). Thereby, fresh clean air taken into the lower space SP2 is brought into contact with the upper surface of the substrate W. Therefore, diffusion of vapor proceeds at various sites on the upper surface of the substrate W. As a result, evaporation of water proceeds at these various sites. Then, the substrate W is rotated at a high speed rotation, by which water on the upper surface of the substrate W can be spun off. Thereby, the ultrathin film 56 is completely removed from the upper surface of the substrate W and, consequently, the upper surface of the substrate W can be favorably dried.

After elapse of a predetermined period of time from the start of the spin drying step (S4), the controller 3 controls the spin motor 23 to stop rotation of the spin chuck 5. Thereafter, the transfer robot CR advances into the processing unit 2 to carry a substrate W which has been processed outside the processing unit 2 (Step S5). The substrate W is delivered from the transfer robot CR to the transfer robot IR and housed in the carrier C by the transfer robot IR.

Figure 7:
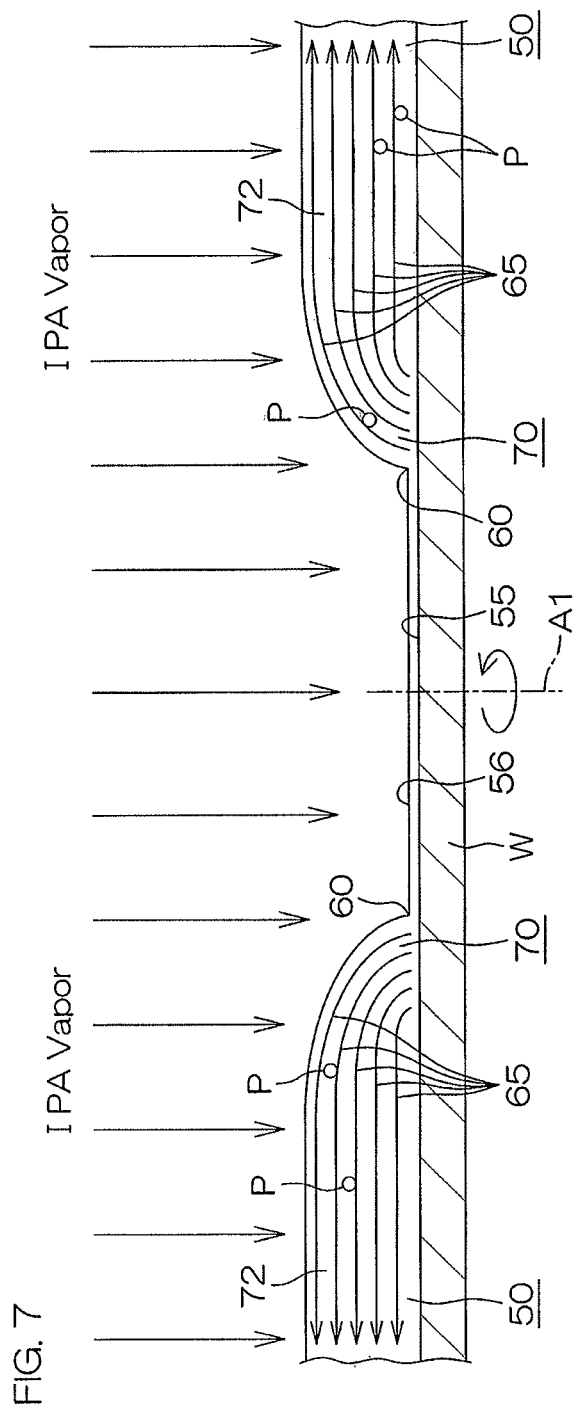
FIG. 7 is an enlarged cross sectional view which shows a state of a liquid film of water during the thin film region expanding step.

FIG. 7 is an enlarged cross sectional view for showing a state of the liquid film of water 50 during the thin film region expanding step T3.

The rotational speed of the substrate W is accelerated to a thin film forming speed, by which water at a central portion of the liquid film of water 50 is subjected to a centrifugal force resulting from rotation of the substrate W, pressed and expanded outward in a radial direction. As a result, the liquid film of water 50 is decreased in thickness at the central portion of the upper surface of the substrate W to form the ultrathin film of water 56 at this portion.

Since the organic solvent vapor atmosphere is kept around the ultrathin film of water 56, a large amount of an organic solvent is dissolved into the ultrathin film of water 56, and therefore, the ultrathin film of water 56 contains the organic solvent at a high concentration. Since the organic solvent vapor atmosphere is kept around an entire area on the upper surface of the substrate W, diffusion of the organic solvent vapor does not proceed to reduce or prevent progressive evaporation of the organic solvent contained in the ultrathin film of water 56. Therefore, water is not completely removed at the central portion of the liquid film of water 50 and the ultrathin film of water 56 is stored at the portion. That is, the thin film region 55 is formed at the portion concerned.

In a state that an organic solvent vapor is filled at the inner space SP, an organic solvent vapor atmosphere is kept around an entire area on the liquid film of water 50 which covers the upper surface of the substrate W and also around an entire area on the ultrathin film of water 56. Therefore, the organic solvent vapor is dissolved into the liquid film of water 50 and the ultrathin film of water 56. Therefore, due to a difference in the organic solvent in concentration on the basis of a difference in local thickness between the liquid film of water 50 and the ultrathin film of water 56 which are communicatively connected, there occurs the Marangoni convection 65 which flows from the ultrathin film of water 56 to the bulk 72 side on the liquid film of water 50 inside the inner circumferential portion 70 of the liquid film of water.

The ultrathin film of water 56 has a thickness which is less than a wavelength of visible light (for example, several nm). It is preferable that the ultrathin film of water 56 has a thickness which is made as thin as possible due to the following two reasons.

A first reason will be described as follows. That is, in order to intensify the Marangoni convection 65, it is necessary to increase a difference in concentration between the liquid film of water 50 and the ultrathin film of water 56 (that is, the organic solvent of the ultrathin film of water 56 is further increased in concentration). The ultrathin film of water 56 is made into a thinner film, by which the organic solvent can be increased in the amount of a unit volume to raise the concentration of the organic solvent of the ultrathin film of water 56.

A second reason will be described as follows. That is, where the ultrathin film of water 56 is thick, the organic solvent is relatively high in concentration at a superficial portion of the ultrathin film of water 56 and relatively low at a basic layer portion of the ultrathin film of water 56. As a result, the Marangoni convection occurs even inside the ultrathin film of water 56 to weaken the Marangoni convection 65 which flows from the ultrathin film of water 56 to the bulk 72.

Figure 8:
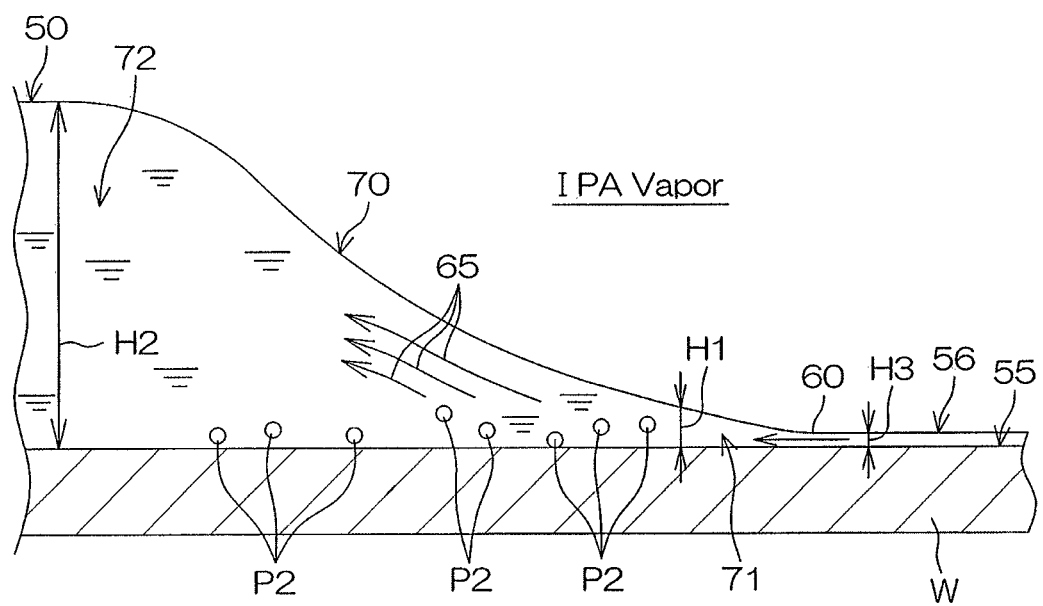
FIG. 8 is a drawing for describing a mechanism of occurrence of the Marangoni convection inside an inner circumferential portion of the liquid film of water.

FIG. 8 is a drawing for describing a mechanism of occurrence of the Marangoni convection 65 inside the inner circumferential portion 70 of the liquid film of water.

In a state that a substrate W is rotated and thin film region 55 (refer to FIG. 7) is also formed at the liquid film of water 50, the liquid film of water 50 develops a portion different in thickness due to a centrifugal force resulting from rotation of the substrate W. That is, thickness H1 of the liquid film is very thin at a neighboring region 71 of the boundary 60 on the liquid film of water 50 (hereinafter, simply referred to as "boundary neighboring region 71"), and thickness H2 of the liquid film is thick at the bulk 72 of the liquid film of water 50, (H2>H1). For example, H1 is equal to several nm, while H2 is equal to about 7 mm.

Further, the ultrathin film of water 56 is formed in continuation to the neighboring region 71 of the boundary 60. Thickness of the ultrathin film of water 56 is set to be H3. H3 is equal to several nm.

The organic solvent vapor is kept at a high concentration state around the liquid film of water 50 and the ultrathin film of water 56. In this state, the organic solvent vapor is dissolved uniformly into various sites of the liquid film of water 50 and the ultrathin film of water 56. The ultrathin film of water 56 is relatively high in organic solvent concentration as compared with the bulk 72. As a result, there occurs a concentration gradient inside of the liquid film of water 50 and the ultrathin film of water 56 which are mutually communicated, thereby resulting in occurrence of the Marangoni convection 65 which flows from the ultrathin film 56 to the bulk 72. This Marangoni convection 65 not only cancels a thermal convection 76 (refer to FIG. 10) occurring at a second portion 70B to be described later (refer to FIG. 10), but the Marangoni convection 65 creates, at the second portion 70B (refer to FIG. 10), a new flow which flows from the boundary neighboring region 71 to the bulk 72. Therefore, where fine particles P2 are contained in the liquid film of water at the inner circumferential portion 70 (specifically, a second portion 70B shown in FIG. 10), as shown in FIG. 8, the fine particles P2 are subjected to a strong force in a direction from the boundary neighboring region 71 to the bulk 72, that is, a direction separating from the boundary 60 by being subjected to the Marangoni convection 65. Thereby, the fine particles P2 contained in the boundary neighboring region 71 move outward in a radial direction (direction separating from the boundary 60).

Figure 9A:
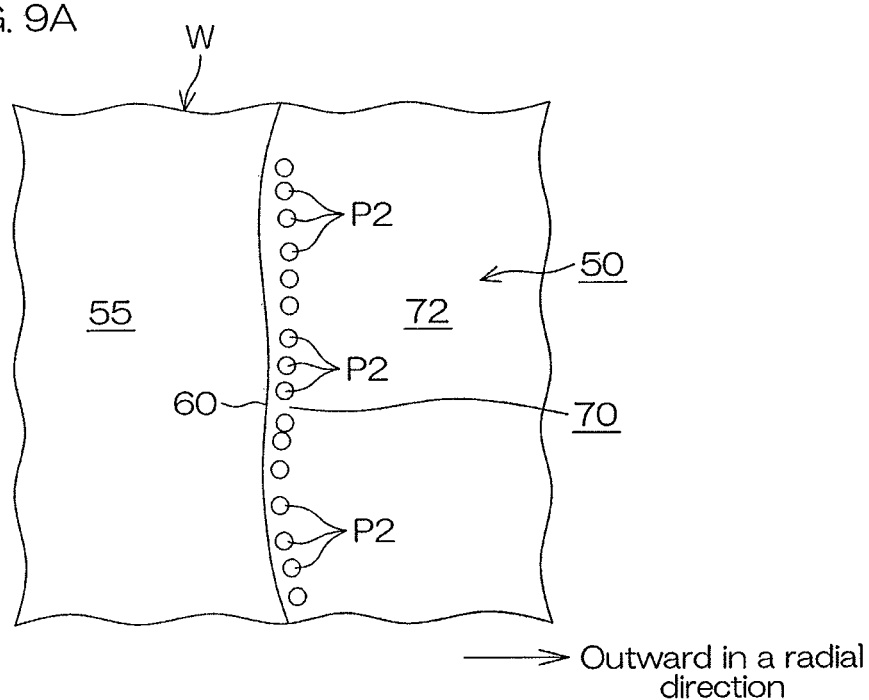
FIGS. 9A, 9B are each a plan view which shows a state of the inner circumferential portion of the liquid film of water during expansion of the thin film region.
Figure 9B:
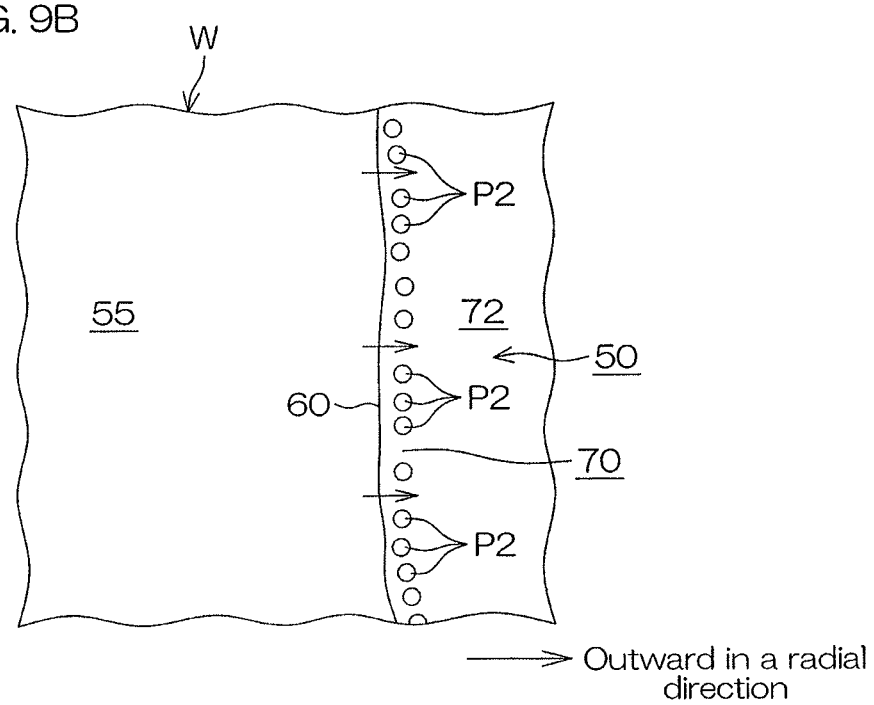

FIG. 9A and FIG. 9B are each a plan view for describing a state of the inner circumferential portion 70 of the liquid film of water during expansion of the thin film region 55. FIG. 9A shows a state that the fine particles P2 are contained at the inner circumferential portion 70 (specifically, the second portion 70B shown in FIG. 10) of the liquid film of water. The fine particles P2 are arranged along a line of the boundary 60.

In this case, the fine particles P2 contained at the inner circumferential portion 70 (second portion 70B) of the liquid film of water move outward in a radial direction (direction separating from the boundary 60) by being subjected to the Marangoni convection 65 (refer to FIG. 7) which flows in a direction separating from the boundary 60 and, as a result, are taken into the bulk 72 of the liquid film of water 50. Then, in association with expansion of the thin film region 55, the boundary 60 moves outward of the substrate W in a radial direction (direction which moves to the bulk 72). However, the thin film region 55 is expanded, with the fine particles P2 taken into the bulk 72. That is, in association with expansion of the thin film region 55, the boundary 60 moves outward of the substrate W in a radial direction, by which, as shown in FIG. 9B, the fine particles P2 also move outward in a radial direction.

Then, the thin film region 55 is expanded to an entire surface on the substrate W and the liquid film of water 50 is completely expelled from the upper surface of the substrate W (a state shown in FIG. 6E), by which the liquid film of water 50 large in thickness is removed from the upper surface of the substrate W. The fine particles P2 contained in the bulk 72 of the liquid film of water 50 are removed from the upper surface of the substrate W together with the liquid film of water 50, without appearing at the thin film region 55.

Further, after completion of the thin film region expanding step T3, the atmosphere at the inner space SP (lower space SP2) is replaced with clean air from the organic solvent vapor. In addition, the substrate W is continuously rotated, with the high rotation of about 1000 rpm kept. Thereby, the ultrathin film 56 is completely removed from the upper surface of the substrate W and, consequently, the upper surface of the substrate W can be favorably dried.

In a state that the atmosphere around the upper surface of the substrate W is replaced with clean air, the substrate W is rotated at a high speed. In this case, fresh clean air is brought into contact with the upper surface of the substrate W, by which diffusion of an organic solvent proceeds at various sites of the upper surface of the substrate W, and the ultrathin film of water 56 including the organic solvent undergoes progressive evaporation. Therefore, the substrate W is rotated at a high speed to shake off the ultrathin film of water 56. It is, thereby, possible to completely dry the upper surface of the substrate W.

As described above, according to the preferred embodiment, the thin film region forming step T2 and the thin film region expanding step T3 are sequentially executed, while the organic solvent vapor atmosphere is filled around an entire area on the liquid film of water 50 which covers the upper surface of the substrate W. Therefore, irrespective of an expansion situation of the thin film region 55, until complete expansion of the thin film region 55, the organic solvent vapor atmosphere is kept around the inner circumferential portion 70 of the liquid film of water and the ultrathin film of water 56.

In a state that the organic solvent vapor atmosphere is kept around the inner circumferential portion 70 of the liquid film of water and the ultrathin film of water 56, a substrate W is rotated, by which, due to a difference in the organic solvent in concentration on the basis of a difference in local thickness between the liquid film of water 50 and the ultrathin film of water 56 which are mutually communicated, there occurs the Marangoni convection 65 which flows from the ultrathin film of water 56 via the inner circumferential portion 70 of the liquid film of water to the bulk 72 of the liquid film of water 50. Therefore, over an entire period of time during the thin film region forming step T2 and the thin film region expanding step T3, it is possible to continuously cause the Marangoni convection 65 which flows from the ultrathin film of water 56 to the bulk 72 of the liquid film of water 50.

Therefore, the fine particles P2 contained at the inner circumferential portion 70 of the liquid film of water are subjected to the Marangoni convection 65 and move in a direction which moves to the bulk 72, that is, a direction separating from the boundary 60. Therefore, the particles are taken into the liquid film of water 50. In association with expansion of the thin film region 55, the boundary 60 moves outward of the substrate W in a radial direction (a direction which moves to the bulk 72). However, the thin film region 55 is expanded, with the fine particles P2 taken into the liquid film of water 50. Then, the fine particles P2 contained in the liquid film of water 50 are expelled from the upper surface of the substrate W together with the liquid film of water 50, without appearing at the thin film region 55. Thereafter, the ultrathin film 56 is removed from the upper surface of the substrate W to dry the upper surface of the substrate W.

Thereby, no fine particles P2 will remain on the upper surface of the substrate W after the substrate W has been dried. Consequently, it is possible to dry an entire area on the upper surface of the substrate W, while reducing or preventing occurrence of the fine particles P2.

Further, since the ultrathin film 56 contains a large amount of the organic solvent, it is possible to reduce occurrence of a water mark after drying.

Further, in the puddle rinse step T1, since no large centrifugal force is applied to a substrate W, it is possible to keep large the thickness of the liquid film of water 50 formed on the upper surface of the substrate W. Where the liquid film of water 50 is large in thickness, in the thin film region expanding step T3, it is possible to keep large a concentration gradient of the organic solvent occurring in the liquid film of water 50 and the ultrathin film of water 56 which are communicatively connected and thereby to intensify the Marangoni convection 65 occurring in the inner circumferential portion 70 of the liquid film of water.

Further, in the thin film region expanding step T3, the substrate W is rotated at a high speed, by which a strong centrifugal force is applied to the substrate W, and a difference in film thickness between the liquid film of water 50 and the ultrathin film of water 56 which are mutually communicated can be made more conspicuous by the centrifugal force. Thereby, it is possible to keep large a concentration gradient of the organic solvent occurring in the inner circumferential portion 70 of the liquid film of water and consequently to further intensify the Marangoni convection 65 occurring at the inner circumferential portion 70 of the liquid film of water.

Further, the substrate W is housed at the inner space SP of the processing chamber 4 which is a closed chamber and an organic solvent vapor is also supplied from the first organic solvent vapor supplying unit 8 to the inner space SP. Thereby, it is possible to apply an organic solvent vapor atmosphere to an entire area on the inner space SP and reliably retain the organic solvent vapor atmosphere around an entire area on the upper surface of the substrate W.

Then, a description will be given of a mechanism of occurrence of particles on execution of the spin drying step (S4).

FIG. 10 is a drawing which shows a flow distribution model on a gas-liquid-solid interface with respect to the liquid film of water 50 (liquid film of processing liquid) on the upper surface of the substrate W according to a reference mode.

In the reference mode, as with the processing example according to the previously described preferred embodiment, there are executed a puddle rinse step T1, a liquid film-removed region forming step (corresponding to the thin film region forming step T2) and a liquid film-removed region expanding step (corresponding to the thin film region expanding step T3). However, this reference mode is different from the previously-descried preferred embodiment in that, in the liquid film-removed region forming step and the liquid film-removed region expanding step, an organic solvent vapor atmosphere is not realized around an entire area on an upper surface of a substrate W but an atmosphere of dry air is realized around an entire area on the upper surface. Further, in the reference mode, in the thin film region forming step T2, as being different from the previously described preferred embodiment, no organic solvent vapor atmosphere is sprayed to the central portion of the upper surface of the substrate W, but a liquid film-removed region 155 (corresponding to the thin film region 55 of the previously described preferred embodiment) is formed only by a centrifugal force resulting from rotation of the substrate W.

In this case, as shown in FIG. 10, in the liquid film-removed region expanding step, a thermal convection 76 occurs inside the inner circumferential portion 70 of the liquid film of water. The thermal convection 76 inside the inner circumferential portion 70 of the liquid film of water flows in a direction separating from the boundary 60 in a first region 70A which is located on the bulk 72 side. However, it flows from the bulk 72 side to the boundary 60 side at a second portion 70B including the boundary neighboring region 71 on the boundary 60 side, as shown in FIG. 10. Therefore, where the fine particles P2 (refer to FIG. 11 to FIG. 13A, etc.) are contained at the second portion 70B of the inner circumferential portion 70, the fine particles P2 are drawn to the boundary 60 side, resulting in aggregation thereof at the boundary neighboring region 71. This aggregation of the fine particles P2 is considered not only due to the previously described thermal convection 76 alone but also due to a van der Waals force and a Coulomb force acting between adjacent fine particles P2.

Figure 11:
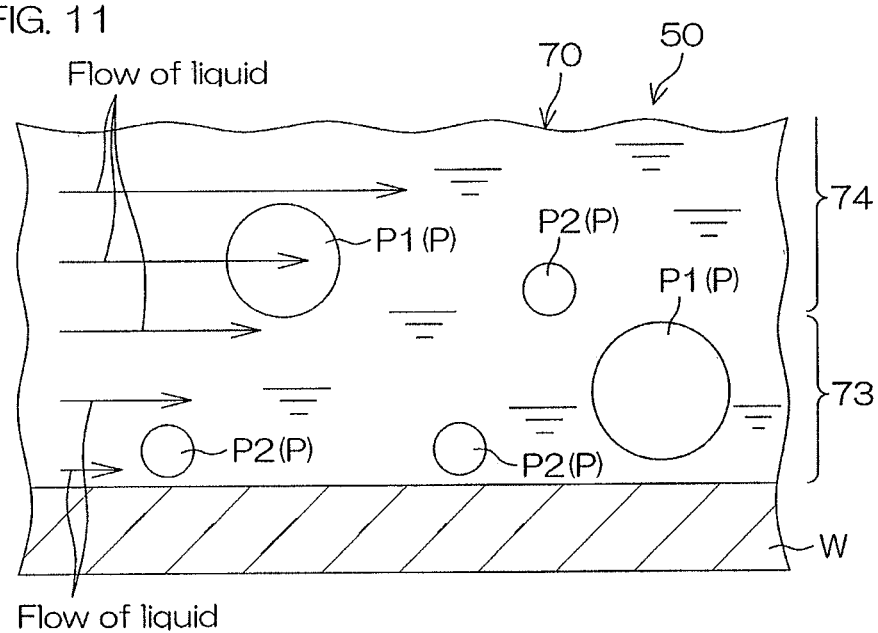
FIG. 11 is a schematic cross sectional view which shows movement of fine particles contained at the inner circumferential portion of the liquid film of water according to the reference mode.
Figure 12:
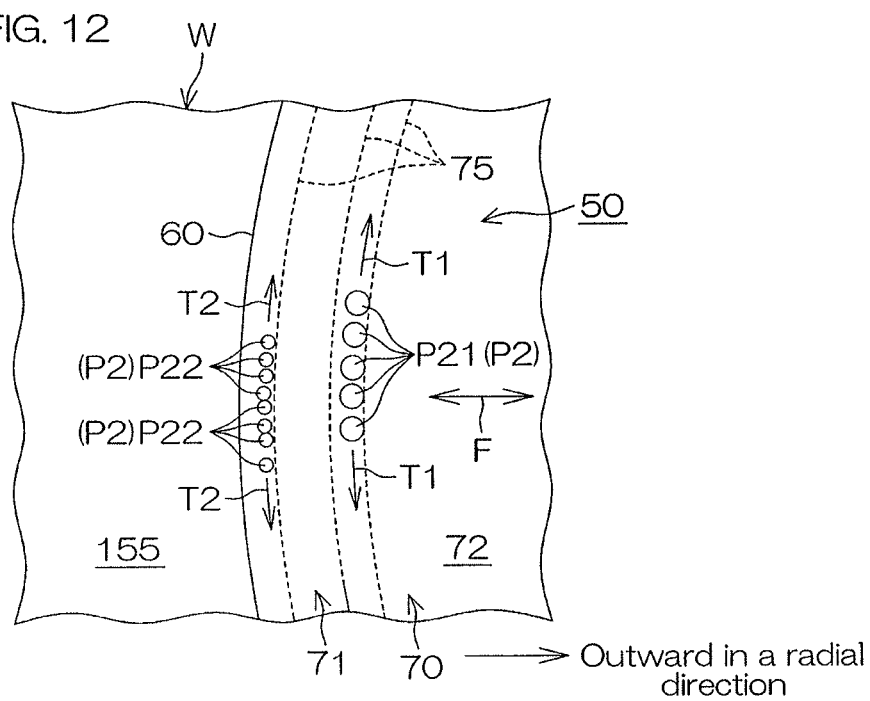
FIG. 12 is a schematic plan view which shows movement of fine particles contained at the inner circumferential portion of the liquid film of water according to the reference mode.

FIG. 11 is a schematic cross sectional view which shows behavior of the fine particles P2 contained at the inner circumferential portion 70 of the liquid film of water according to the reference mode. FIG. 12 is a schematic plan view which shows behavior of the fine particles P2 contained at the inner circumferential portion 70 of the liquid film of water according to the reference mode.

As shown in FIG. 11, the inner circumferential portion 70 of the liquid film of water includes a boundary layer 73 formed in the vicinity of a boundary with the upper surface of the substrate W and a flowing layer 74 which is formed on an opposite side of the upper surface of the substrate W with respect to the boundary layer 73. Where the fine particles P2 are contained at the inner circumferential portion 70 of the liquid film of water, particles P are strongly affected by a flow on the flowing layer 74, irrespective of a particle size of them. Therefore, the particles P on the flowing layer 74 are able to move in a direction along the flow.

On the other hand, large particles P1 are affected by a flow on the boundary layer 73, while the fine particles P2 are hardly affected by the flow. That is, the large particles P1 on the boundary layer 73 are able to move inside the boundary layer 73 in a direction along the flow, while the fine particles P2 will not move inside the boundary layer 73 in a direction F along the flow (refer to FIG. 12). However, the fine particles P2 do not adhere on the upper surface of the substrate W but are provided on the upper surface of the substrate W, with minute intervals kept.

At the boundary neighboring region 71 shown in FIG. 10, the inner circumferential portion 70 of the liquid film of water substantially constitutes the boundary layer 73 shown in FIG. 11. Then, in FIG. 10, the flowing layer 74 (refer to FIG. 11) is accordingly increased in ratio, while moving from the boundary neighboring region 71 to the bulk 72 side. Therefore, the fine particles P2 existing at the boundary neighboring region 71 will not move in a direction along the flow unless another large force is exerted.

As shown in FIG. 12, an interference fringe 75 is found macroscopically at the boundary neighboring region 71 due to a difference in the liquid film 50 in thickness. The interference fringe 75 is formed in the shape of a contour line.

As described previously, the fine particles P2 will not move in a direction F along the flow (refer to FIG. 12) but are able to move in a tangential direction D1 or D2 of the interference fringe 75. The fine particles P2 are arranged to form a line along the tangential direction D1 or D2 of the interference fringe 75 at the boundary neighboring region 71. In other words, the fine particles P2 are arranged along the line of the boundary 60. The fine particles P2 form a line for each size of the particles P themselves. Fine particles P21 having a relatively large diameter are disposed outward in a radial direction from fine particles P22 having a relatively small diameter.

Figure 13A:
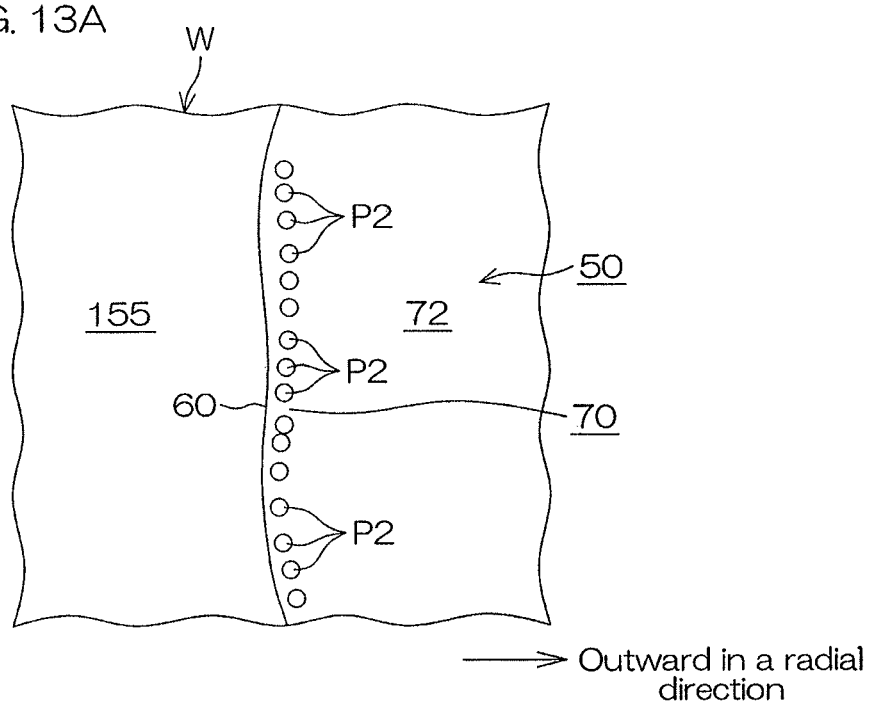
FIGS. 13A, 13B are each a plan view which shows a state of the inner circumferential portion of the liquid film of water during expansion of the liquid film-removed region according to the reference mode.
Figure 13B:
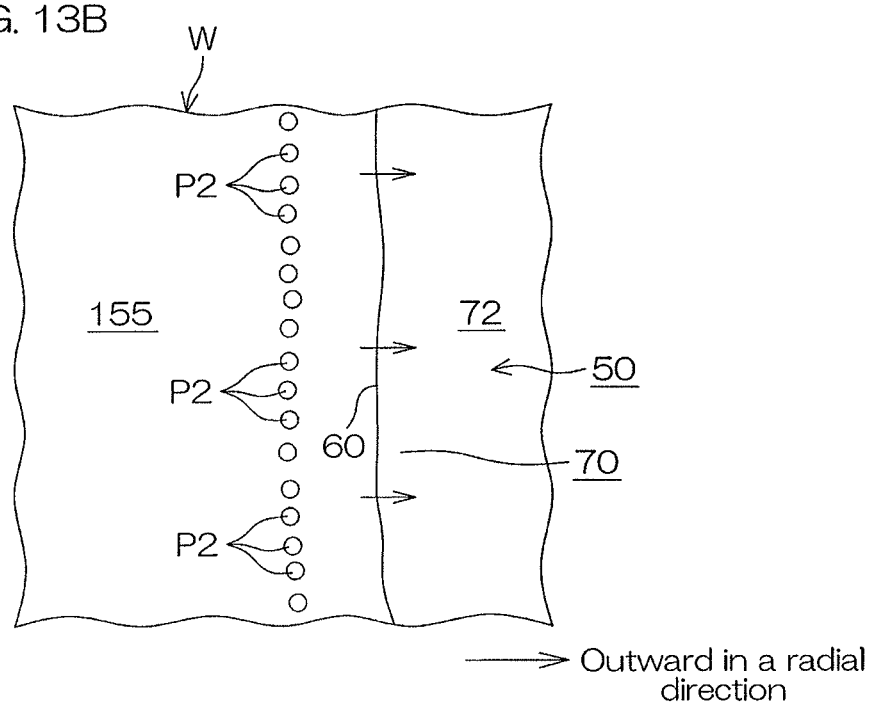

FIG. 13A and FIG. 13B are each a plan view which shows a state of the liquid film of water at the inner circumferential portion 70 during expansion of the liquid film-removed region 155 (corresponding to the thin film region 55 of the previously described preferred embodiment) according to the reference mode.

FIG. 13A shows a state that the fine particles P2 are contained at the inner circumferential portion 70 of the liquid film of water (specifically, the second portion 70B shown in FIG. 10). The fine particles P2 are arranged along the line of the boundary 60.

As shown in FIG. 13B, in association with expansion of the liquid film-removed region 155, the boundary 60 moves outward of the substrate W in a radial direction (direction which moves to the bulk 72), by which the thermal convection 76 (refer to FIG. 10) which flows from the bulk 72 side to the boundary 60 side occurs at the boundary neighboring region 71 and, therefore, a force which presses inward in a radial direction is applied to the fine particles P2. In association with expansion of the liquid film-removed region 155, the boundary 60 moves outward of the substrate W in a radial direction (direction which moves to the bulk 72). However, since the fine particles P2 are not able to move in a radial direction (direction along the flow), the fine particles P2 will not move even after movement of the boundary 60. Therefore, the fine particles P2 contained in the boundary neighboring region 71 move from the boundary 60 to the liquid film-removed region 155 to precipitate on the liquid film-removed region 155. Then, the fine particles P2 remain on the upper surface of the substrate W after removal of the liquid film of water 50.

Figure 14:
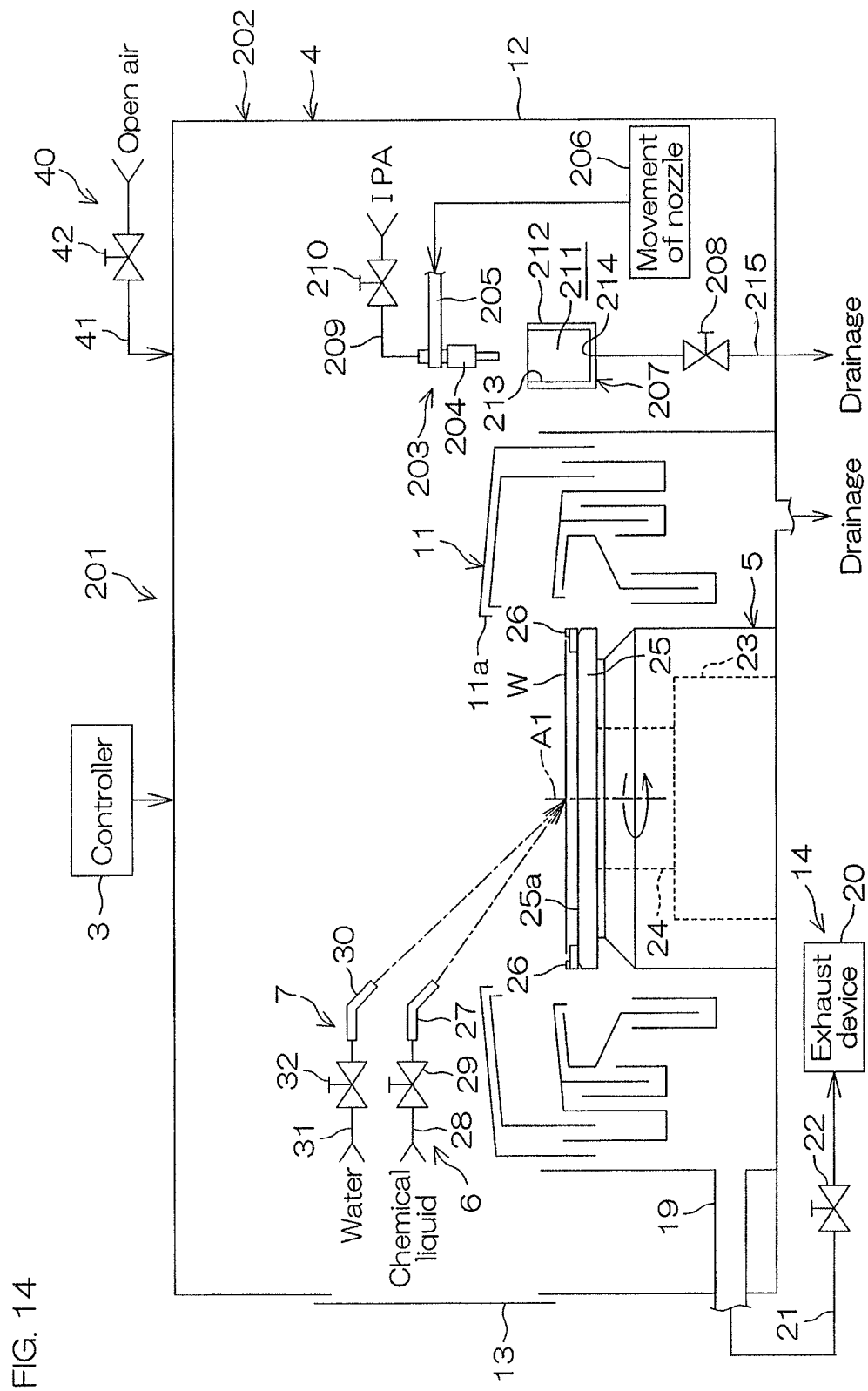
FIG. 14 is an illustrative cross sectional view for describing a configuration example of a processing unit of a substrate processing apparatus according to a second preferred embodiment of the present invention.

FIG. 14 is an illustrative cross sectional view which describes a configuration example of a processing unit 202 of a substrate processing apparatus 201 according to a second preferred embodiment of the present invention.

In the second preferred embodiment, portions corresponding to those shown in the previously described first preferred embodiment are given the same reference numbers as those of FIG. 1 to FIG. 9, with a description thereof omitted.

The processing unit 202 differs from the processing unit 2 of the first preferred embodiment in that the first organic solvent vapor supplying unit 8 is not used and in that an organic solvent liquid discharge unit (low surface tension liquid supplying unit) 203 for discharging a liquid of IPA is provided as one example of an organic solvent liquid which is the low surface tension liquid.

The organic solvent liquid discharge unit 203 includes an organic solvent liquid nozzle 204 (nozzle) for discharging a liquid of IPA, a second nozzle arm 205 at which the organic solvent liquid nozzle 204 is mounted at a leading end portion thereof, a second nozzle movement unit 206 which moves the organic solvent liquid nozzle 204 by moving the second nozzle arm 205, a standby pot 207 (retaining container) disposed around a processing cup 11 in a plan view, and a drainage valve 208 for switching between drainage and drainage stoppage of the liquid inside the standby pot 207. The gas supplying unit is constituted with the organic solvent liquid discharge unit 203, the organic solvent liquid nozzle 204 and the standby pot 207.

Organic solvent pipe 209 for supplying the organic solvent (IPA) which is a liquid at normal temperature from an organic solvent supply source to the organic solvent liquid nozzle 204 is connected to the organic solvent liquid nozzle 204. An organic solvent valve 210 for switching between supply and supply stoppage of the liquid of the organic solvent from the organic solvent pipe 209 to the organic solvent liquid nozzle 204 is placed on the organic solvent pipe 209.

The standby pot 207 is a pot for receiving a liquid of organic solvent discharged from the organic solvent liquid nozzle 204 disposed at a retraction position which is retracted from an upper surface of a substrate W. The standby pot 207 includes a box-shaped housing 212 for defining an inner space 211. The housing 212 is provided with an opening 213 formed on an upper surface of the housing 212 and an outlet 214 formed on a bottom wall 212a of the housing 212. One end of the drainage pipe 215 is connected to the outlet 214 of the standby pot 207. The other end of the drainage pipe 215 is connected to drainage treatment equipment out of the apparatus. A drainage valve 208 is placed at a middle portion of the drainage pipe 215. The controller 3 controls motions for opening and closing the drainage valve 208.

In a state that the organic solvent liquid nozzle 204 is placed at a retraction position, the controller 3 closes the drainage valve 203 and opens the organic solvent valve 210 to discharge a liquid of organic solvent from the organic solvent liquid nozzle 204, thus making it possible to store the liquid of organic solvent at an inner space 211 of the standby pot 207.

The substrate processing executed by the substrate processing apparatus 201 differs from that by the substrate processing apparatus 1 according to the first preferred embodiment in that an organic solvent vapor atmosphere is kept around an entire area on the upper surface of the substrate W not according to a technique of supplying organic solvent vapor from the first organic solvent vapor supplying unit 8 to the inner space SP but according to a technique of retaining a liquid of organic solvent at the inner space 211 of the standby pot 207 to fill the organic solvent vapor resulting from evaporation of the liquid of organic solvent at the inner space SP.

Specifically, the controller 3 closes the clean air valve 42 in synchronization with start of the puddle rinse step T1. Thereby, the inner space SP is in a closed state of being kept blocked from the outside, and the processing chamber 4 functions as a closed chamber which is kept blocked from the outside.

The controller 3 also opens the organic solvent valve 210 while closing the drainage valve 208 in synchronization with start of the puddle rinse step T1. Thereby, the liquid of organic solvent is retained in the inner space 211 of the standby pot 207. When the liquid of organic solvent retained in the inner space 211 reaches a predetermined amount, discharge of the liquid of organic solvent from the organic solvent liquid nozzle 204 is stopped. The organic solvent retained in the inner space 211 is lower in boiling point than water and, therefore, larger in an amount of evaporation. Organic solvent vapor resulting from evaporation of the liquid of organic solvent is supplied to the inner space SP and filled at an entire area on the inner space SP.

Further, the controller 3 opens the drainage valve 208 after completion of the thin film region expanding step T3. Thereby, the drainage pipe 215 is opened to feed the liquid of organic solvent retained in the inner space 211 to drainage treatment equipment out of the apparatus via the drainage pipe 215. The controller 3 also opens the clean air valve 42 and the exhaust valve 22 to replace an atmosphere at the inner space SP with clean air from the organic solvent vapor.

Figure 15A:
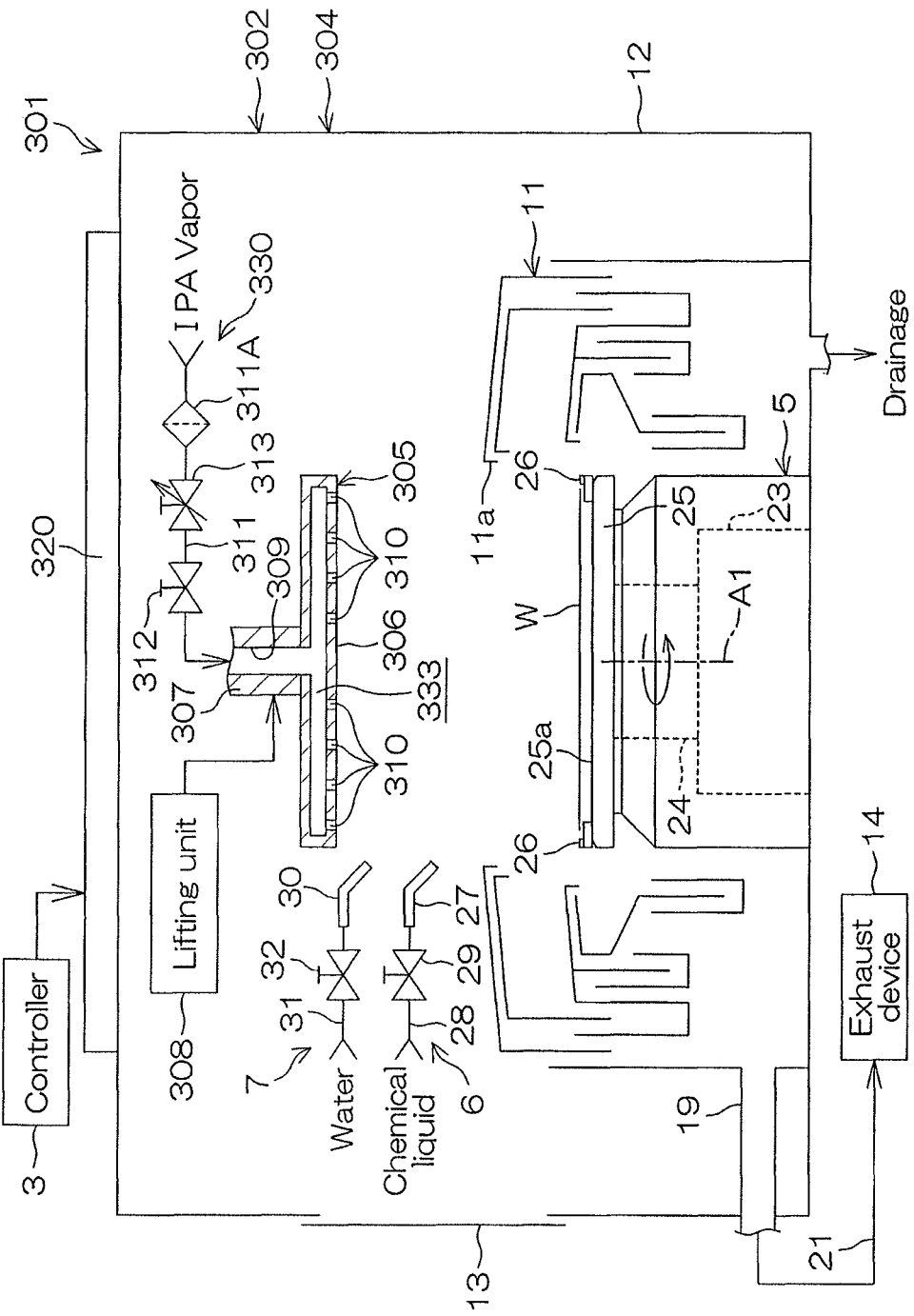
FIG. 15A is an illustrative cross sectional view for describing a configuration example of a processing unit of a substrate processing apparatus according to a third preferred embodiment of present invention.
Figure 15B:
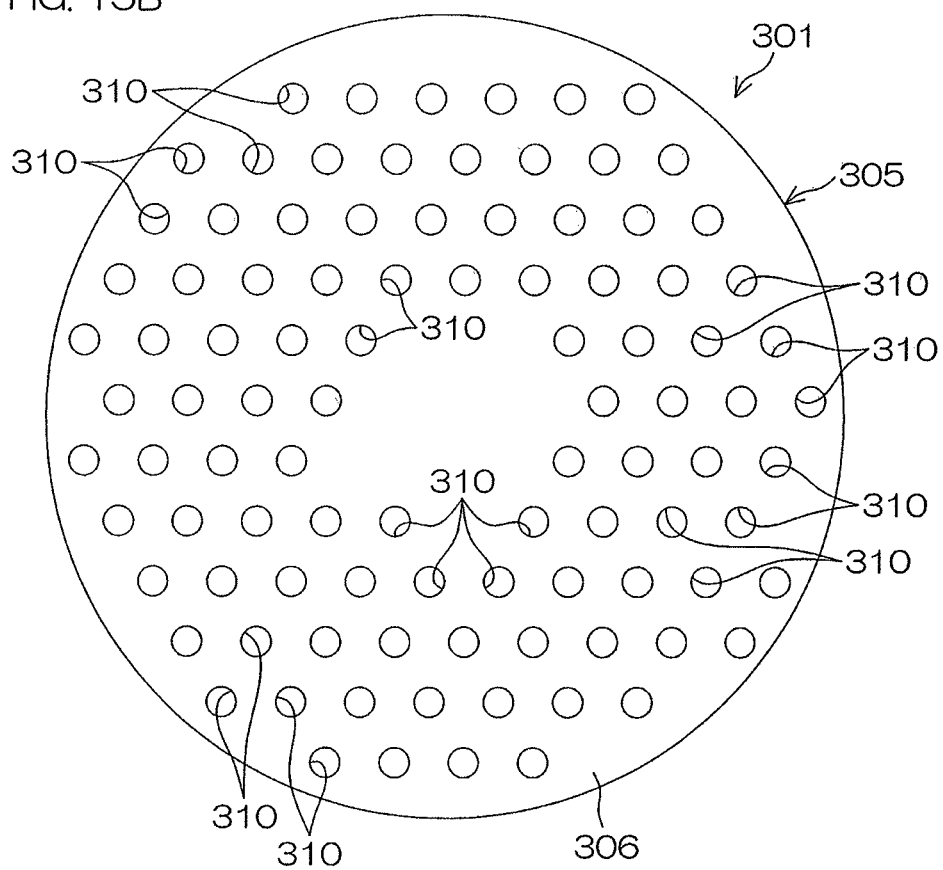
FIG. 15B is a bottom view of a facing member.

FIG. 15A is an illustrative cross sectional view for describing a configuration example of a processing unit 302 of a substrate processing apparatus 301 according to a third preferred embodiment of the present invention. FIG. 15B is a bottom view of a facing member 305.

In the third preferred embodiment, the portions corresponding to those described in the previously described first preferred embodiment are given the same reference numbers as those of FIG. 1 to FIG. 9, with a description thereof omitted.

First, the processing unit 302 differs from the processing unit 2 according to the first preferred embodiment in that it is provided as a chamber with a processing chamber 304 which is not a closed chamber. That is, a first organic solvent vapor supplying unit 8 and an air blowing unit 40 are not connected to the processing chamber 304 and in place of them, the processing chamber 304 is provided with a fan filter unit (FFU) 320 as an air feeding unit for feeding clean air into a partition wall 12. Unlike the first preferred embodiment, exhaust pipe 21 of an exhaust unit 14 is provided so as not to be opened or closed.

In addition, the processing unit 302 differs from the processing unit 2 according to the first preferred embodiment in that it is provided inside the processing chamber 304 with a facing member 305 which faces an upper surface of a substrate W held by a spin chuck 5. A second organic solvent vapor supplying unit (gas supplying unit) 330 for supplying, to a gas discharge port 310, vapor of IPA (IPA vapor) as one example of organic solvent vapor which is the low surface tension liquid is connected to the facing member 305.

An FFU 320 is disposed above a partition wall 12 and mounted on a ceiling of the partition wall 12. The FFU 320 feeds clean air into the processing chamber 304 from the ceiling of the partition wall 12. The FFU 320 and the exhaust unit 14 develop a downflow (descending flow) inside the processing chamber 304.

The facing member 305 is in the shape of a circular plate. The facing member 305 is equal in diameter to a substrate W or larger than the substrate W. A circular facing surface 306 in the shape of a flat surface which faces the upper surface of the substrate W held by the spin chuck 5 is formed on a lower surface of the facing member 305. The facing surface 306 faces an entire area on the upper surface of the substrate W. As shown in FIG. 15B, many (a plurality of) gas discharge ports 310 are disposed separately at an equal density at an entire area excluding a central portion thereof (portion of facing the rotation center of the substrate W) on the facing surface 306.

The facing member 305 is made by using a resin material, for example, PFA (perfluoroalkoxy ethylene), PTFE (polytetrafluoro ethylene) or PVC (polyvinyl chloride). The facing member 305 is hollow. In detail, a first gas supplying channel 333 in the shape of a circular plate is formed inside the facing member 305. The first gas supplying channel 333 is communicatively connected to all the gas discharge ports 310.

A holder 307 which gives a perpendicular axis (perpendicular axis in alignment with the rotation axis A1 of the spin chuck 5) passing through the center of the facing member 305 as a center axis is fixed on the upper surface of the facing member 305. An lifting unit 308 is joined to the holder 307. The facing member 305 is supported by the holder 307 so that the center axis of the facing member 305 is positioned at the rotation axis A1 of the spin chuck 5 and kept in a horizontal posture. The holder 307 is formed hollow, into which a second gas supplying channel 309 is inserted so as to extend in a perpendicular direction. The second gas supplying channel 309 is communicatively connected to the first gas supplying channel 333.

The second organic solvent vapor supplying unit 330 is provided with second organic solvent vapor pipe 311 which is connected to the second gas supplying channel 309. Organic solvent vapor is supplied from an organic solvent vapor supply source to the second organic solvent vapor pipe 311. A second organic solvent vapor valve 312 for opening and closing the second organic solvent vapor pipe 311, a second flow control valve 313 for adjusting a valve aperture of the second organic solvent vapor pipe 311 to adjust a flow rate of organic solvent vapor discharged from each of the gas discharge ports 310, and a second filter 311A for catching dust and dirt contained in the organic solvent vapor circulated through the second organic solvent vapor pipe 311 are placed on the second organic solvent vapor pipe 311. When the second organic solvent vapor valve 312 is opened, the organic solvent vapor (clean organic solvent vapor from which dust and dirt are removed) supplied from the second organic solvent vapor pipe 311 to the second gas supplying channel 309 is discharged downward from the gas discharge port 310.

The lifting unit 308 is connected to the controller 3 (refer to FIG. 2, etc.). The controller 3 controls the lifting unit 308a to elevate and lower the facing surface 306 of the facing member 305 between first to third neighboring positions (for example, the second neighboring position is a position shown in FIG. 17) at which the facing surface 306 thereof comes close to the upper surface of the substrate W held by the spin chuck 5 and a retraction position (position shown in FIG. 15) at which the facing surface 306 is greatly retracted above the spin chuck 5.

The controller 3 is constituted with a microcomputer, for example. The controller 3 is provided with an arithmetic unit such as a CPU, a storage unit such as a read-only-memory device and a hard disk drive, and an input/output unit. The storage unit stores a program which is executed by an arithmetic unit.

The controller 3 controls motions of the lifting unit 308 according to a predetermined program. The controller 3 also controls opening/closing motions of the second organic solvent vapor valve 312, the second flow control valve 313, etc.

In the substrate processing apparatus 301 according to the third preferred embodiment, there is executed substrate processing (S1 to S5 in FIG. 4) similar to that by the substrate processing apparatus 1 according to the first preferred embodiment. Hereinafter, a description will be mainly given of points in which the substrate processing executed by the substrate processing apparatus 301 according to the third preferred embodiment is different from that by the substrate processing apparatus 1 according to the first preferred embodiment.

In the substrate processing, a substrate W which is not yet processed is carried in the processing unit 302 and carried in the processing chamber 304. When the substrate W is carried in, the facing member 305 is disposed at the retraction position. After the substrate W is carried in, the controller 3 executes sequentially the chemical liquid step (S2 in FIG. 4) and the rinse step (S3 in FIG. 4).

FIG. 16 is a time chart for describing the rinse step (S3 in FIG. 4) and the spin drying step (S4 in FIG. 4) executed by the substrate processing apparatus 301.

In the rinse step, after elapse of a predetermined period of time from the start of supplying water, in a state that an entire area on the upper surface of the substrate W is covered with water, the controller 3 controls the spin motor 23, thereby decreasing the rotational speed of the substrate W from a liquid processing speed to a puddle speed (low rotational speed of zero or about 40 rpm or less, for example, about 10 rpm) in stages. That is, a puddle rinse step T1 is executed. The puddle rinse step T1 is a step similar to the puddle rinse step T1 (refer to FIG. 5).

Figure 17:
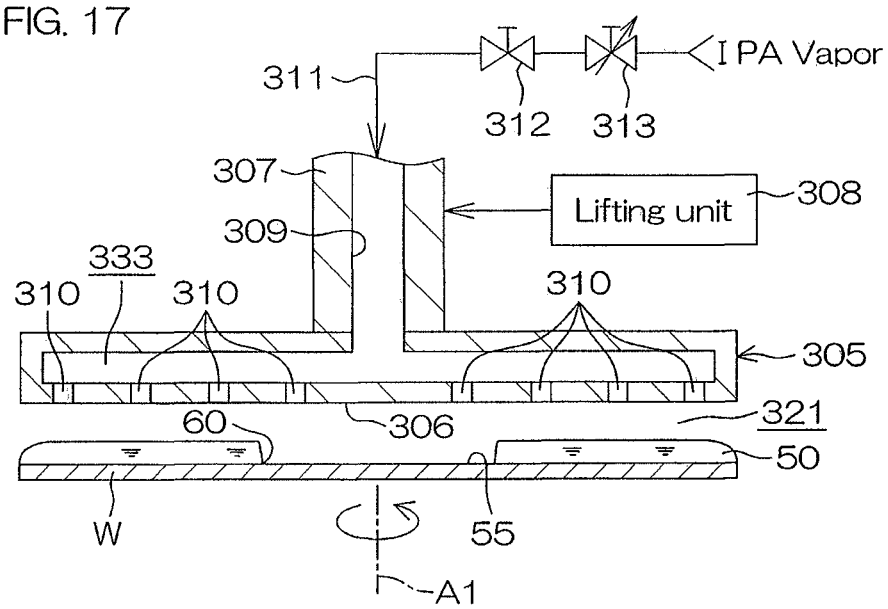
FIG. 17 is a cross sectional view which shows a state at which a facing member is disposed at a second neighboring position.

Further, prior to start of the puddle rinse step T1, the controller 3 controls the lifting unit 308 to lower the facing member 305 to the first neighboring position, as shown in FIG. 17. The first neighboring position of the facing member 305 is such a height that the facing surface 306 is not in contact with an upper surface of the liquid film of water 50 during the puddle rinse step T1. When the facing member 305 is positioned at the first neighboring position, a clearance between the facing surface 306 and the upper surface of the substrate W is about 7 mm, and a narrow space (upper space of the substrate W) 321 which is kept shielded from a surrounding thereof (outside) is formed between the facing surface 306 and the upper surface of the substrate W (shielding step).

Further, the controller 3 opens the second organic solvent vapor valve 312 in synchronization with start of the puddle rinse step T11, thereby discharging organic solvent vapor from the gas discharge port 310. At this time, a total discharge flow rate of the organic solvent vapor from the gas discharge port 310 is a low flow rate of L1 (L/min). Further, a discharge flow rate of the organic solvent vapor from each of the gas discharge ports 310 is equal to each other. The organic solvent vapor discharged from each of the gas discharge ports 310 is supplied to the narrow space 321. Since the narrow space 321 is kept shielded from a surrounding thereof, the supplied organic solvent vapor is filled at the narrow space 321. As a result, the organic solvent vapor is filled around the liquid film of water 50 (vapor atmosphere filling step).

The narrow space 321 kept shielded from the surrounding is hardly affected by disturbance of a peripheral atmosphere. Therefore, an organic solvent vapor atmosphere is kept around an entire area on the upper surface of the substrate W. In other words, the organic solvent vapor atmosphere is kept around an entire area on the upper surface of the substrate W on which the puddle-shaped liquid film of water 50 is formed.

Further, since the plurality of gas discharge ports 310 are separately disposed, it is possible to supply the organic solvent vapor gas uniformly from the discharge ports 310 to the liquid film of water 50 on the substrate W. Still further, a discharge flow rate of the organic solvent vapor from each of the gas discharge ports 310 is small and equal to each other. Therefore, a discharge pressure of the organic solvent vapor from each of the gas discharge ports 310 is equal to each other. It is, thereby, possible to reliably prevent the liquid film of water 50 from undergoing deformation by being pressed by the discharge pressure of the organic solvent vapor. In other words, the plurality of gas discharge ports 310 which are separately disposed assumes a mode in which the ports are provided so as not to be placed locally on the upper surface of the substrate W.

After formation of the puddle-shaped liquid film of water 50, the controller 3 closes the water valve 32 to stop discharge of water from the water nozzle 30. Thereby, the puddle rinse step T11 is completed.

Next, the controller 3 executes the spin drying step (S4 in FIG. 4). The controller 3 first executes a thin film region forming step T12.

The controller 3 also controls the lifting unit 308 in synchronization with a rise in rotational speed of the substrate W, thereby lowering the facing member 305 down to the second neighboring position which is set further below from the first neighboring position. When the facing member 305 is positioned at the second neighboring position, a clearance between the facing surface 306 and the upper surface of the substrate W is about 5 mm and the narrow space 321 is made narrower than before.

In the third preferred embodiment, the controller 3 controls the spin motor 23, thereby accelerating rotation of the substrate W to a predetermined speed (for example, about 50 rpm). The rotational speed of the substrate W reaches a predetermined speed (for example, about 50 rpm), by which a relatively strong centrifugal force is applied to the liquid film of water 50 on the substrate W. Thereby, a circular thin film region 55 is formed at the central portion of the upper surface of the substrate W.

In the thin film region forming step T12, as described previously, the liquid film of water 50 is not subjected to a strong discharge pressure of the organic solvent vapor and, therefore, will not undergo deformation. As a result, the liquid film of water 50 (bulk 72) can be kept as thick as possible to keep a large difference in film thickness between the bulk 72 and the thin film region 55. Thereby, it is possible to intensify the Marangoni convection 65 occurring at the inner circumferential portion 70 of the liquid film of water.

Further, in the thin film region forming step T12, in a state that the liquid film of water 50 is formed on the upper surface of the substrate W, the substrate W is raised in rotational speed. Therefore, the liquid film of water 50 is made thinner in thickness than at the time of the puddle step T11. As a result, in the thin film region forming step T12, on the assumption that the facing member 305 is kept at the same height as the height at the first neighboring position, a space between the upper surface of the liquid film of water 50 and the facing surface 306 is increased in volume only by such an extent that the liquid film of water 50 is made thinner. In this case, there is a possibility that IPA vapor contained at a space between the upper surface of the substrate W and the facing surface 306 may be decreased in concentration. In this case, the organic solvent vapor supplied to the upper surface of the substrate W is decreased in amount and, as a result, there is a possibility that an ultrathin film 56 which constitutes the thin film region 55 may be eliminated totally or partially (broken film or film with holes).

However, with a rise in rotational speed of the substrate W, the controller 3 controls the lifting unit 308 to lower the facing member 305 down to the second neighboring position. Thereby, in the thin film region forming step T12, a space between the upper surface of the liquid film of water 50 and the facing surface 306 is kept at the same volume as a volume at the time of the puddle step T11. Thereby, the organic solvent vapor contained at a space between the upper surface of the substrate W and the facing surface 306 is kept high in concentration. Therefore, in the thin film region forming step T12, it is possible to reduce progressive evaporation of the ultrathin film 56 which constitutes the thin film region 55 and thereby to prevent elimination of the ultrathin film 56 in the thin film region forming step T12.

After the thin film region forming step T12, a thin film region expanding step T13 is executed.

In the thin film region expanding step T13, the controller 3 controls the spin motor 23 to raise the rotational speed of the substrate W to a predetermined drying speed (for example, 1000 rpm). In association with a rise in rotational speed of the substrate W, the thin film region 55 is expanded (refer to FIG. 6D and FIG. 6E).

Further, the controller 3 controls the lifting unit 308 in synchronization with a rise in rotational speed of the substrate W, thereby lowering the facing member 305 down to the third neighboring position set further below from the second neighboring position. When the facing member 305 is positioned at the third neighboring position, a clearance between the facing surface 306 and the upper surface of the substrate W is about 3 mm, and the narrow space 321 is made narrower than before.

Along with expansion of the thin film region 55, the boundary 60 of the liquid film of water 50 between the thin film region 55 and the upper surface of the substrate W moves outward of the substrate W in a radial direction. Then, the thin film region 55 is expanded to an entire surface on the substrate W (refer to FIG. 6E), by which the liquid film of water 50 is all expelled outward of the substrate W.

In the thin film region expanding step T13, as described previously, the liquid film of water 50 is not subjected to a strong discharge pressure of the organic solvent vapor and, therefore, will not undergo deformation. As a result, it is possible to keep the liquid film of water 50 (bulk 72) as thick as possible and also to keep a large difference in film thickness between the bulk 72 and the thin film region 55. It is, thereby, possible to intensify the Marangoni convection 65 occurring at the inner circumferential portion 70 of the liquid film of water.

Further, in the thin film region expanding step T13, in a state that the liquid film of water 50 is formed on the upper surface of the substrate W, the substrate W is raised in rotational speed, by which the liquid film of water 50 is made thinner in thickness than at the time of the thin film region forming step T12. Therefore, in the thin film region expanding step T13, on the assumption that the facing member 305 is kept at the same height as that at the second neighboring position, a space between the upper surface of the liquid film of water 50 and the facing surface 306 is increased in volume only by an extent that the liquid film of water 50 is made thinner. In this case, there is a possibility that the organic solvent vapor contained at a space between the upper surface of the substrate W and the facing surface 305 may be decreased in concentration. In this case, there is also a possibility that the organic solvent vapor supplied to the upper surface of the substrate W may be decreased in amount and, as a result, the ultrathin film 56 which constitutes the thin film region 55 may be totally or partially eliminated (broken film or film with holes).

However, with a rise in rotational speed of the substrate W, the controller 3 controls the lifting unit 308 to lower the facing member 305 down to the third neighboring position. Thereby, in the thin film region expanding step T13, a space between the upper surface of the liquid film of water 50 and the facing surface 306 is kept at the same volume as that at the time of the thin film region forming step T12. Thereby, organic solvent vapor contained at a space between the upper surface of the substrate W and the facing surface 306 is kept high in concentration. Therefore, in the thin film region expanding step T13, it is possible to reduce progressive evaporation of the ultrathin film 56 which constitutes the thin film region 55 and thereby to prevent elimination of the ultrathin film 56 in the thin film region expanding step T13.

Over an entire period of time during the thin film region expanding step T13, the organic solvent vapor is continuously discharged from the gas discharge port 310. Therefore, over an entire period of time during the thin film region expanding step T13, the organic solvent vapor is kept on an entire area on the upper surface of the substrate W. Therefore, irrespective of an expansion situation of the thin film region 55, an atmosphere around the inner circumferential portion 70 of the liquid film of water can be continuously kept in the organic solvent vapor atmosphere.

After the thin film region 55 has been expanded to an entire area on the upper surface of the substrate W, the controller 3 completes the thin film region expanding step T13. In association with completion of the thin film region expanding step T13, the controller 3 closes the second organic solvent vapor valve 312 to stop discharge of the organic solvent vapor from the gas discharge port 310. The controller 3 also controls the lifting unit 308, thereby elevating the facing member 305 from the third neighboring position to a separating position. Thereby, the atmosphere on an entire area on the upper surface of the substrate W is replaced with clean air from the organic solvent vapor.

Thereafter, the controller 3 continuously rotates the substrate W, keeping the rotational speed at about 1000 rpm (thin film removing step). Thereby, the ultrathin film 56 is completely removed from the upper surface of the substrate W and, consequently, the upper surface of the substrate W can be favorably dried.

After elapse of a predetermined period of time from the start of the spin drying step (S4 in FIG. 4), the controller 3 controls the spin motor 23 to stop rotation of the spin chuck 5. Thereafter, a substrate W which has been processed is carried out from the processing unit 302 by the transfer robot CR (S5 in FIG. 4).

Although the three preferred embodiments of the present invention have been so far described, the present invention may be executed by still another embodiment.

Figure 18:
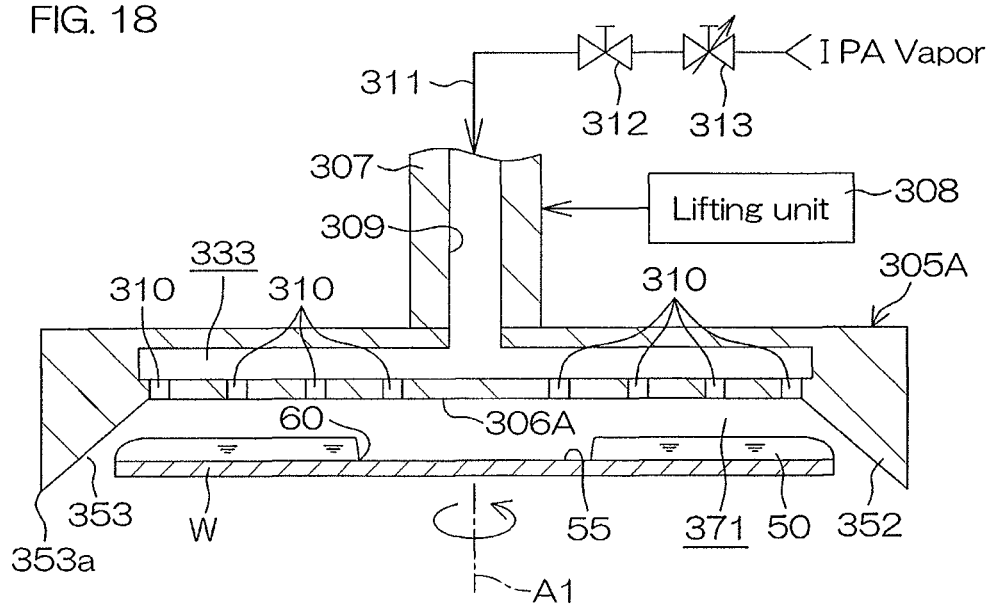
FIG. 18 is a cross sectional view which shows a modification example of a substrate processing apparatus according to the third preferred embodiment of the present invention.

FIG. 18 is a drawing which shows a modification example of the substrate processing apparatus 301 according to the third preferred embodiment of the present invention.

In FIG. 18, portions common to those of the third preferred embodiment are given the same reference numbers as those of FIG. 15 to FIG. 17, with a description thereof omitted. In the modification example shown in FIG. 18, a facing member 305A is provided in place of the facing member 305 according to the third preferred embodiment.

The facing member 305A is in the shape of a circular plate. The facing member 305A may be equal in diameter to a substrate W or may be larger than the substrate W, as shown in FIG. 18. A facing surface 306A which faces an upper surface of the substrate W held by a spin chuck 5 is formed on a lower surface of the facing member 305A. A central portion of the facing surface 306A is formed in a horizontally flat shape. An annular protruding portion 352 (facing peripheral portion) is formed at a peripheral portion of the facing surface 306A. A tapered surface 353 which is declined as moving outward in a radial direction is formed on a lower surface of the annular protruding portion 352. As shown in FIG. 18, where the facing member 305A is larger in diameter than the substrate W, a peripheral edge of the facing member 305A is extended outward from a peripheral edge of the substrate W, in a plan view.

In a state that the facing member 305A is disposed at first to third neighboring positions, as shown in FIG. 18, an outer peripheral end 353a of the tapered surface 353 is positioned below from the upper surface of the substrate W in relation to a vertical direction. Therefore, a narrow space (upper space of the substrate W) 371 which is defined by the facing surface 306A and the upper surface of the substrate W forms a sealed space which is substantially closed from a surrounding thereof (outside), and kept shielded substantially completely from the surrounding (shielding step). And, a clearance between the peripheral portion of the upper surface of the substrate W and the annular protruding portion 352 (that is, the tapered surface 353) is provided to be much narrower than a clearance between a central portion of the facing surface 306A and a central portion of the upper surface of the substrate W.

In this case, the narrow space 371 which is defined by the facing surface 306A and the upper surface of the substrate W is substantially closed from an external space thereof and, therefore, organic solvent vapor supplied to the narrow space 371 is hardly expelled from the narrow space 371. The narrow space is not affected either by disturbance of a peripheral atmosphere. Thereby, an entire area on the upper surface of the substrate W can continue to be kept reliably in an organic solvent vapor atmosphere.

Further, in the third preferred embodiment and the mode described in FIG. 18 which is a modification example thereof, a description has been given by referring to a configuration example in which each of the gas discharge ports 310 discharges the organic solvent vapor downward in a perpendicular direction. However, it is also possible to adopt a configuration in which each of the gas discharge ports 310 discharges the organic solvent vapor obliquely in an outer circumference direction as the organic solvent vapor moves further downward.

Further, in the third preferred embodiment and the mode of FIG. 18 which is a modification example thereof, the gas discharge ports 310 may be disposed at a central portion of the facing surfaces 306 or 306A. In this case, the organic solvent vapor from the gas discharge port 310 disposed at the central portion of the facing surface 306 or 306A is preferably weaker in discharge pressure than the organic solvent vapor from the other gas discharge ports 310.

Further, the gas discharge port 310 may be disposed at a site other than the facing surface 306 or 306A. The gas discharge port 310 may be provided, for example, around the spin base 25 and also at a position below the substrate W held by the spin base 25.

Further, in the previously described first and second preferred embodiments, the first organic solvent vapor supplying unit 8 has been described as a unit for supplying the organic solvent vapor. However, the supplying unit 8 may be constituted to supply a mixed gas of the organic solvent vapor and an inert gas (for example, nitrogen gas). Similarly, in the previously described third preferred embodiment, it has been described that the organic solvent vapor is supplied to the gas discharge port 310. However, a mixed gas of the organic solvent vapor and an inert gas (for example, nitrogen gas) may be supplied.

Further, in each of the previously described preferred embodiments, the rotational speed (first high speed) of the substrate W in the thin film region expanding step T3 has been described to be equal to the rotational speed (second high speed) of the substrate W (in the thin film removing step) for removing the ultrathin film 56 (1000 rpm). However, the first high speed and the second high speed may be different from each other.

Further, in each of the previously described preferred embodiments, there has been described a configuration in which the rotational speed of the substrate W is kept at a puddle speed to form the puddle-shaped liquid film of water 50 on the upper surface of the substrate W and the thin film region 55 is provided on the puddle-shaped liquid film of water 50. However, the liquid film of water 50 is not limited to the puddle shape and the thin film region 55 may be provided on the liquid film of water which is rotated at a speed higher than the puddle speed.

Further, in each of the previously described preferred embodiments, IPA which is one example of the organic solvent has been described as a low surface tension liquid lower in surface tension than water. The low surface tension liquid may include, for example, organic solvents such as methanol, ethanol, acetone, and HFE (hydrofluoro ether) other than IPA.

Further, in each of the previously described preferred embodiments, there has been described an example in which the processing liquid which constitutes the liquid film (liquid film of water 50) of the processing liquid is water. However, the processing liquid which constitutes the liquid film may be IPA (liquid). In this case, HFE may be adopted as vapor of the low surface tension liquid.

Further, in each of the previously described preferred embodiments, there has been described a case where the substrate processing apparatus 1, 201 or 301 is an apparatus for processing a circular-plate shaped substrate W. However, the substrate processing apparatus 1, 201 or 301 may be an apparatus for processing polygonal substrates such as glass substrates for liquid crystal displays.

While preferred embodiments of the present invention have been described in detail, it should be understood that these embodiments are merely illustrative of the technical principles of the present invention but not illustrative of the present invention. The scope of the present invention is to be limited only by the appended claims.

The present application corresponds to Japanese Patent Application No. 2015-161326 filed in the Japan Patent Office on Aug. 18, 2015, and the entire disclosure of this application is incorporated herein by reference.

REFERENCE SIGNS LIST

1: Substrate processing apparatus
4: processing chamber (closed chamber)
5: Spin chuck (substrate holding unit)
7: Water supplying unit (processing liquid supplying unit)
8: First organic solvent vapor supplying unit (internal gas supplying unit, gas supplying unit)
201: Substrate processing apparatus
203: Organic solvent liquid discharge unit (low surface tension liquid supplying unit, gas supplying unit)
204: Organic solvent liquid nozzle (nozzle, gas supplying unit)
207: Standby pot (retaining container, gas supplying unit)
301: Substrate processing apparatus
304: processing chamber
330: Second organic solvent vapor supplying unit (gas supplying unit)
352: Protruding portion (facing peripheral portion)
SP: Inner space
W: Substrate

The invention claimed is:
1. A substrate processing method, comprising:
a substrate holding step which holds a substrate horizontally;
a liquid film forming step in which a processing liquid is supplied to an upper surface of the substrate to form a liquid film of the processing liquid which covers the upper surface of the substrate so as to cover an entire area of the upper surface of the substrate;
a puddle step in which, in parallel with the liquid film forming step, the substrate is selectively kept stationary or rotating at a puddle speed around a rotation axis vertically extending through a central portion of the substrate;
a thin film region forming step in which the substrate is rotated around the rotation axis at a predetermined thin film region forming speed to partially remove the processing liquid from the liquid film of the processing liquid, thereby forming a thin film region in the liquid film of the processing liquid where a thin film of the processing liquid covers the upper surface of the substrate, the thin film of the processing liquid in the thin film region being connected to a remaining portion of the liquid film of the processing liquid which is thicker than the thin film of the processing liquid in the thin film region;
a thin film region expanding step in which the thin film region is expanded to an outer circumference of the substrate after the thin film region forming step, such that a boundary between the thin film region and the remaining portion of the liquid film of the processing liquid moves toward the outer circumference of the substrate so that the thin film region extends over the entire area of the upper surface of the substrate so that the thin film of the processing liquid covers the entire area of the upper surface of the substrate;
a vapor atmosphere filling step in which, in parallel with the thin film region forming step and the thin film region expanding step, a vapor atmosphere which contains vapor of a low surface tension liquid whose surface tension is lower than a surface tension of the processing liquid is filled around the liquid film of the processing liquid, such that an entire surrounding area of the upper surface of the substrate is kept in the vapor atmosphere which contains the vapor of the low surface tension liquid in a manner that the vapor of the low surface tension liquid dissolves into the liquid film of the processing liquid uniformly over an entire surface region of the liquid film of the processing liquid, the vapor atmosphere filling step keeping, throughout the thin film region forming step and the thin film region expanding step, a concentration of the vapor of the low surface tension liquid in the vapor atmosphere at the entire surrounding area of the upper surface of the substrate at such a concentration that evaporation of the processing liquid in the thin film of the processing liquid that contains therein the dissolved low surface tension liquid vapor is suppressed so as to prevent formation of a breakage or a hole in the thin film of the processing liquid in the thin film region; and
a thin film removing step in which after expansion of the thin film region to the entire area on the upper surface of the substrate by the thin film region expanding step, the thin film is removed from the upper surface, the thin film removing step including an atmosphere replacement step in which the vapor atmosphere around the upper surface of the substrate is replaced with an atmosphere of a gas other than the vapor of the low surface tension liquid, the atmosphere replacing step being initiated in a state in which the entire surrounding area of the upper surface of the substrate is filled with the vapor atmosphere by the vapor atmosphere filling step.

2. The substrate processing method according to claim 1 which further includes a shielding step in which a space including an upper space of the substrate is placed into a shielded state which is kept shielded from outside, wherein after the shielding step, the vapor of the low surface tension liquid is supplied to the space to execute the vapor atmosphere filling step.

3. The substrate processing method according to claim 1, wherein the thin film removing step includes a high-speed rotation step in which the substrate is rotated around the rotation axis at a predetermined high rotational speed, while a space including the upper space of the substrate is opened to the outside.

4. The substrate processing method according to claim 1, wherein the thin film region expanding step includes a first high-speed rotation step of rotating the substrate around the rotation axis at a first high speed which is faster than the thin film region forming speed.

5. The substrate processing method according to claim 1, wherein the thin film removing step includes
a step of stopping a supply of the vapor of the low surface tension liquid to the surrounding area of the upper surface of the substrate, and
a second high-speed rotation step which rotates the substrate around the rotation axis at a second high speed which is faster than the thin film region forming speed in parallel with the atmosphere replacing step.

6. The substrate processing method according to claim 1, wherein the processing liquid includes water, and
the low surface tension liquid includes isopropyl alcohol.

7. The substrate processing method according to claim 2, wherein the thin film removing step includes a high-speed rotation step in which the substrate is rotated around the rotation axis at a predetermined high rotational speed, while the space is opened to the outside.

8. The substrate processing method according to claim 1, wherein the thin film region forming step is performed without spraying a gas that causes a deformation of the liquid film of the processing liquid.

9. The substrate processing method according to claim 1, wherein the vapor atmosphere filling step supplies the vapor of the low surface tension liquid without any carrier gas to the entire surrounding area of the upper surface of the substrate.

10. The substrate processing method according to claim 1, wherein
the substrate is rotated around the rotation axis, during the thin film region expanding step, at a high speed which is faster than the predetermined thin film region forming speed,
the substrate is kept rotating around the rotation axis at the high speed during the thin film region removing step, and
a supply of the vapor of the low surface tension liquid to the surrounding area of the upper surface of the substrate for the vapor atmosphere filling step is stopped during the thin film region removing step.

11. The substrate processing method according to claim 1, wherein the vapor atmosphere filling step is performed in a manner that continuously produces Marangoni convection in the liquid film of the processing liquid in a direction from the thin film region toward the remaining portion of the liquid film of the processing liquid throughout the thin film region forming step and the thin film region expanding step.

* * * * *